(12) United States Patent
Masuoka et al.

(10) Patent No.: US 10,186,601 B2
(45) Date of Patent: Jan. 22, 2019

(54) METHOD FOR PRODUCING SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 138 days.

(21) Appl. No.: 15/342,217

(22) Filed: Nov. 3, 2016

(65) Prior Publication Data

US 2017/0077267 A1 Mar. 16, 2017

Related U.S. Application Data

(60) Division of application No. 14/793,108, filed on Jul. 7, 2015, now Pat. No. 9,525,038, which is a
(Continued)

(51) Int. Cl.
*H01L 29/66* (2006.01)
*H01L 29/423* (2006.01)
(Continued)

(52) U.S. Cl.
CPC .. *H01L 29/66666* (2013.01); *H01L 21/28114* (2013.01); *H01L 29/42356* (2013.01);
(Continued)

(58) Field of Classification Search
CPC ................................................. H01L 29/42392
See application file for complete search history.

(56) References Cited

U.S. PATENT DOCUMENTS

| 2007/0284623 | A1* | 12/2007 | Kim | H01L 27/0207 257/213 |
| 2008/0173937 | A1* | 7/2008 | Chung | H01L 29/0657 257/329 |
| 2012/0142154 | A1 | 6/2012 | Masuoka et al. | |

FOREIGN PATENT DOCUMENTS

| JP | H02-071556 A | 3/1990 |
| JP | H02-188966 A | 7/1990 |

(Continued)

OTHER PUBLICATIONS

Mistry et al., "A 45nm Logic Technology with High-k+Metal Gate Transistors, Strained Silicon, 9 Cu Interconnect Layers, 193nm Dry Patterning, and 100% Pb-free Packaging", *IEEE*, pp. 247-250, 2007.

(Continued)

*Primary Examiner* — Yu-Hsi D Sun
(74) *Attorney, Agent, or Firm* — Brinks Gilson & Lione

(57) ABSTRACT

A method for producing a semiconductor device includes a first step of forming a fin-shaped semiconductor layer on a semiconductor substrate and forming a first insulating film around the fin-shaped semiconductor layer; and a second step following the first step and including forming a second insulating film around the fin-shaped semiconductor layer, depositing a first polysilicon on the second insulating film to conduct planarization, forming a second resist for forming a gate line and a pillar-shaped semiconductor layer so that the second resist extends in a direction perpendicular to a direction in which the fin-shaped semiconductor layer extends, and etching the first polysilicon, the second insulating film, and the fin-shaped semiconductor layer to form a pillar-shaped semiconductor layer and a first dummy gate formed of the first polysilicon.

6 Claims, 40 Drawing Sheets

Related U.S. Application Data continuation of application No. PCT/JP2013/065998, filed on Jun. 10, 2013.

(51) Int. Cl.
 *H01L 21/28* (2006.01)
 *H01L 29/78* (2006.01)
 *H01L 29/786* (2006.01)

(52) U.S. Cl.
 CPC .. *H01L 29/42364* (2013.01); *H01L 29/42392* (2013.01); *H01L 29/6653* (2013.01); *H01L 29/66545* (2013.01); *H01L 29/66795* (2013.01); *H01L 29/785* (2013.01); *H01L 29/7827* (2013.01); *H01L 29/78618* (2013.01); *H01L 29/78642* (2013.01); *H01L 29/78696* (2013.01); *H01L 2029/7858* (2013.01)

(56) References Cited

FOREIGN PATENT DOCUMENTS

| JP | H03-145761 A | 6/1991 |
|---|---|---|
| JP | 2009-182317 A | 8/2009 |
| JP | 2010-251586 A | 11/2010 |
| WO | WO 2009/110050 A1 | 11/2009 |
| WO | WO 2013/069102 A1 | 5/2013 |
| WO | WO 2013/080378 A | 6/2013 |

OTHER PUBLICATIONS

Wu et al., "High Performance 22/20nm FinFET CMOS Devices with Advanced High-K/Metal Gate Scheme", IEEE, pp. 27.1.1-27.1.4, 2010.
International Search Report and Written Opinion with English Translation for PCT/JP2013/065998 dated Aug. 20, 2013, 5 pages.
International Preliminary Report on Patentability and English language translation thereof, in corresponding International Application No. PCT/JP2013/065998 dated Dec. 23, 2015, 11 pages.
Office Action in corresponding U.S. Appl. No. 14/793,108, dated May 19, 2016, 7 pages.
Notice of Allowance in corresponding U.S. Appl. No. 14/793,108, dated Sep. 23, 2016, 7 pages.

\* cited by examiner

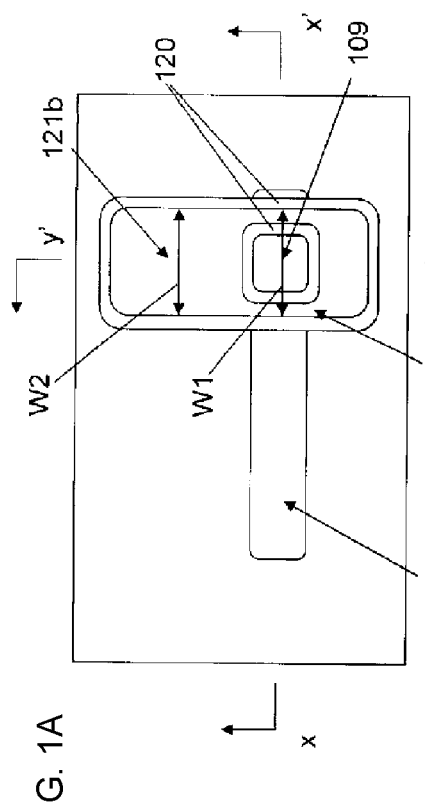
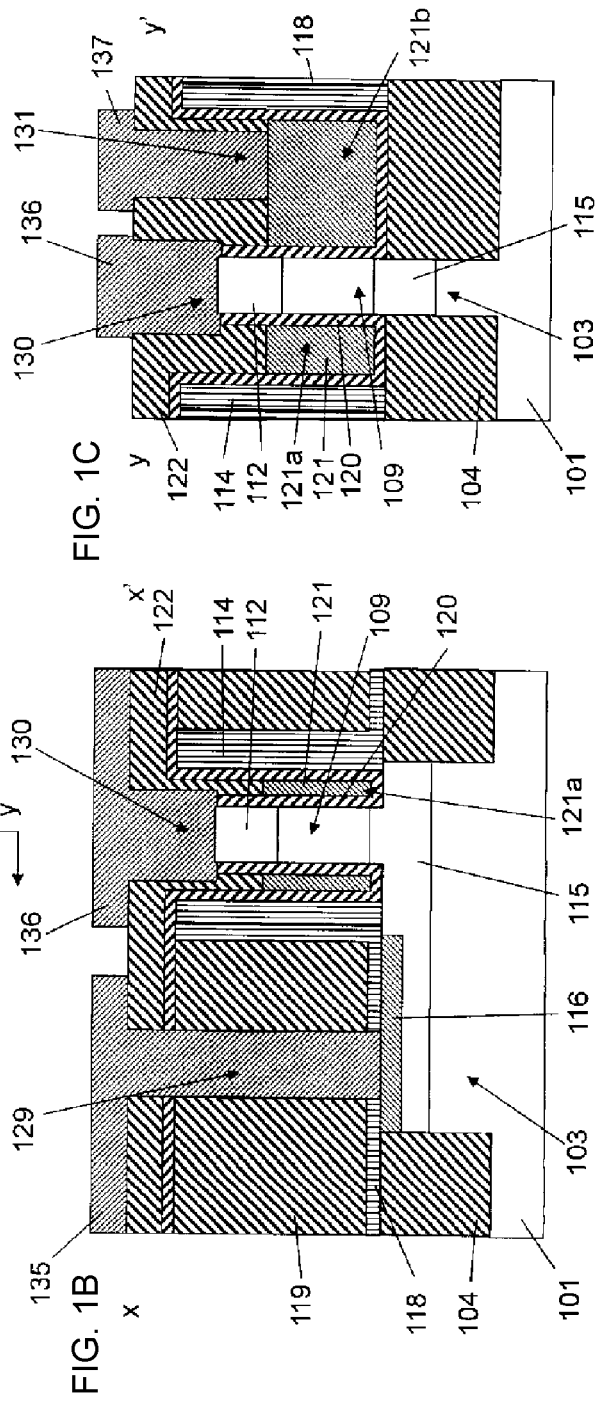
FIG. 1A
FIG. 1B
FIG. 1C

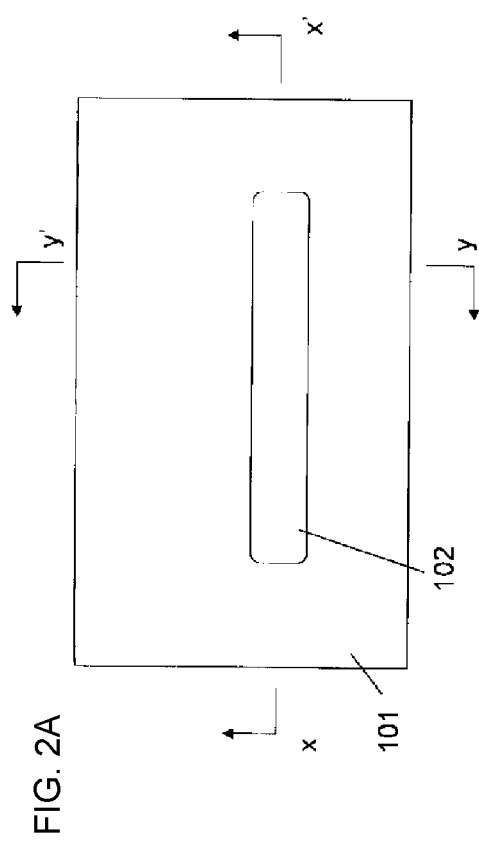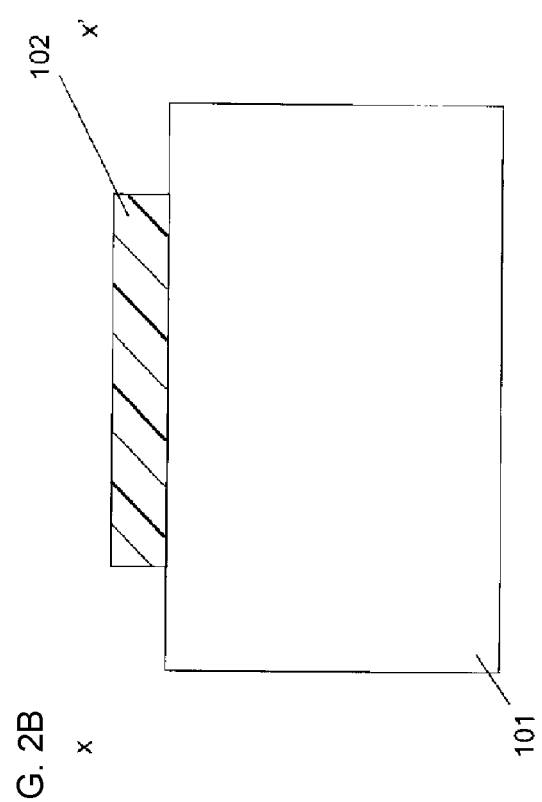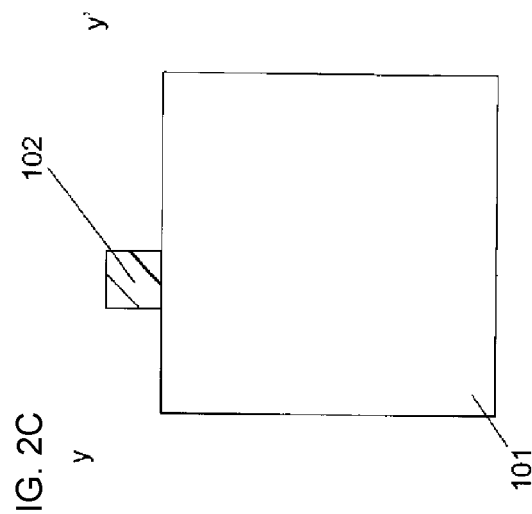

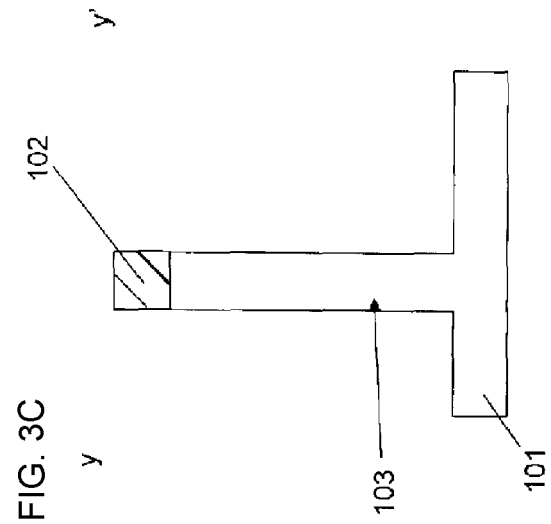
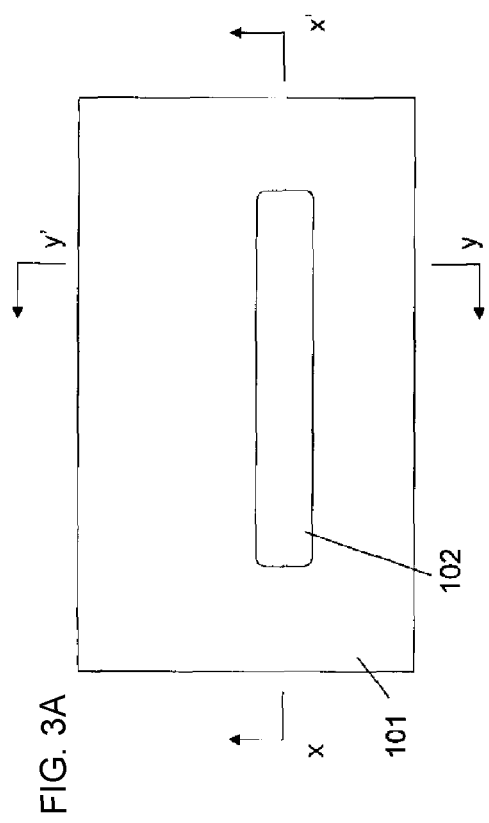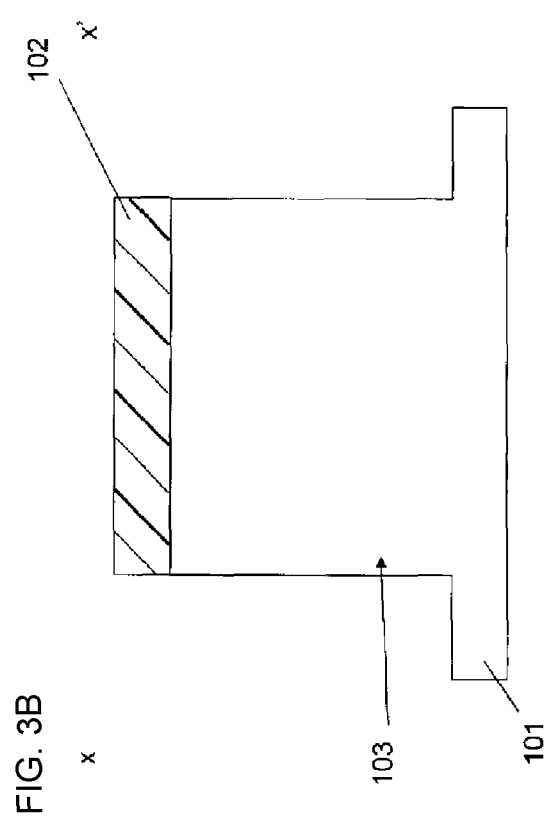

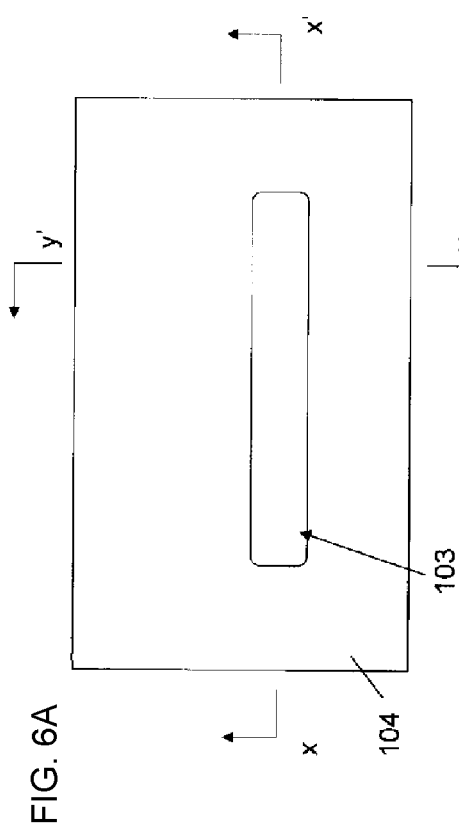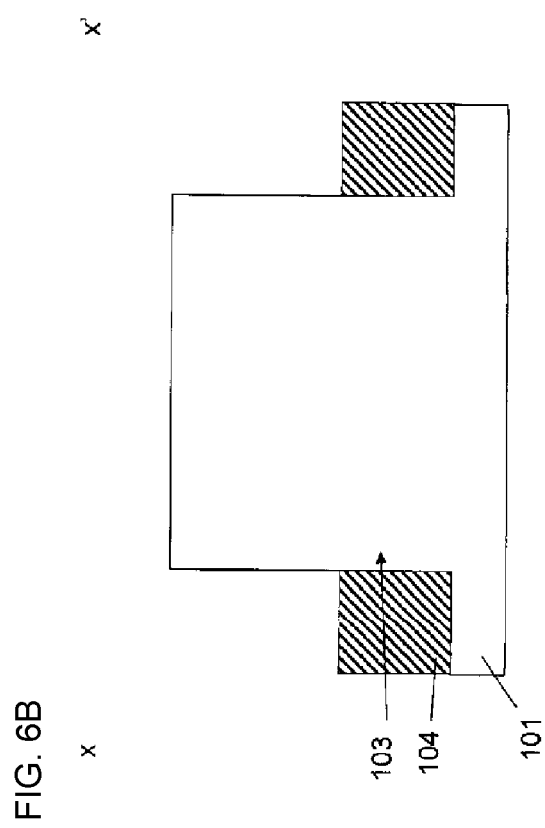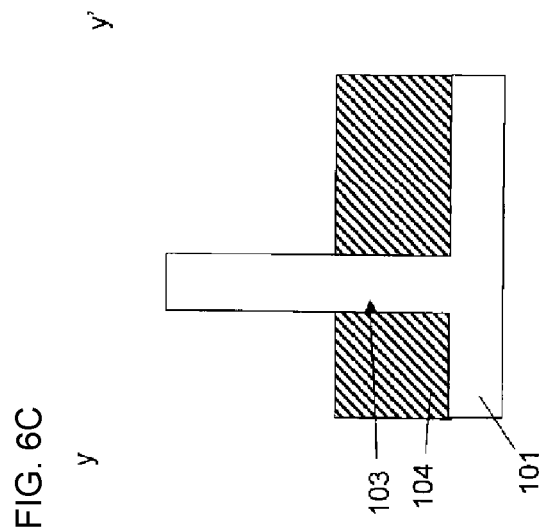

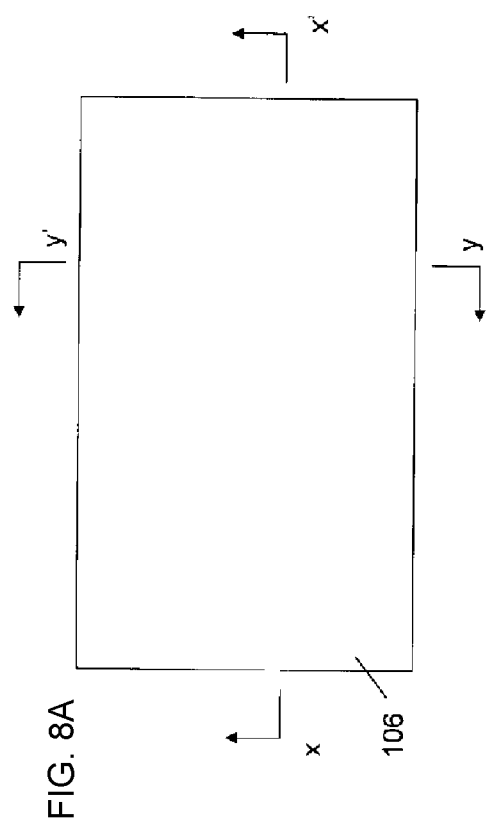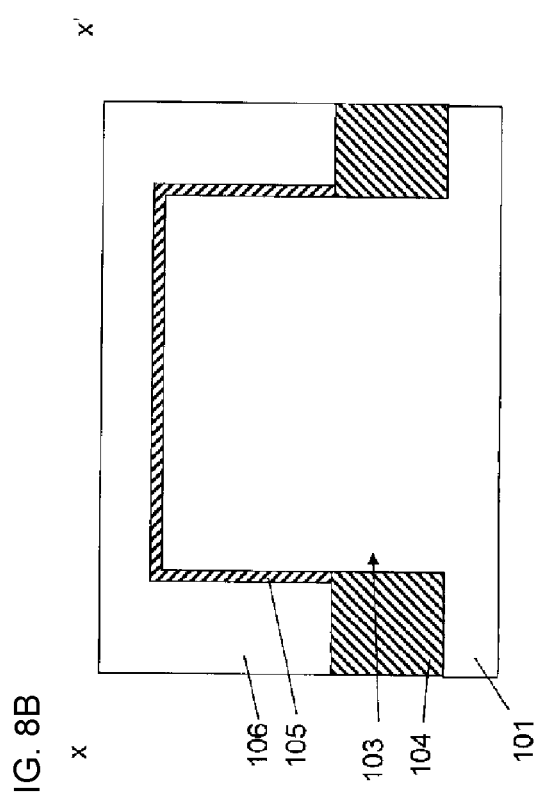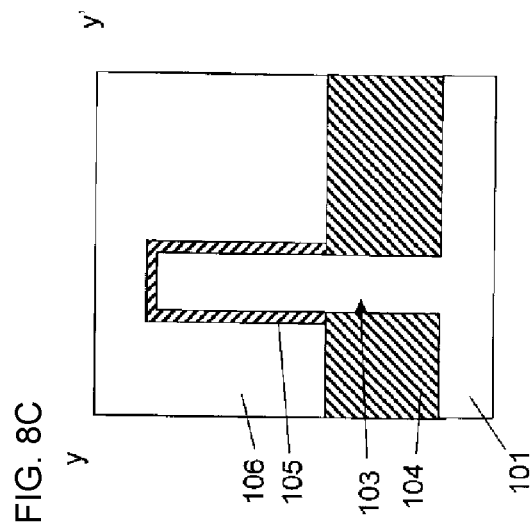

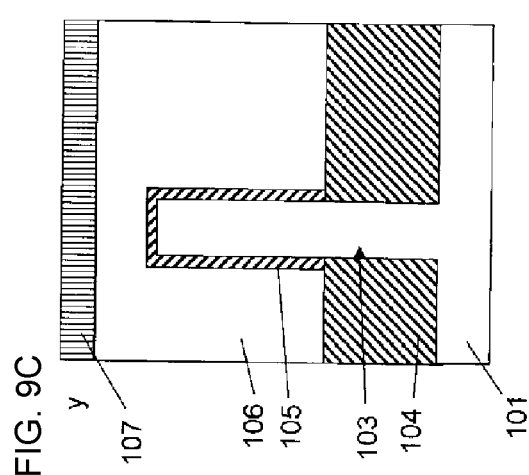
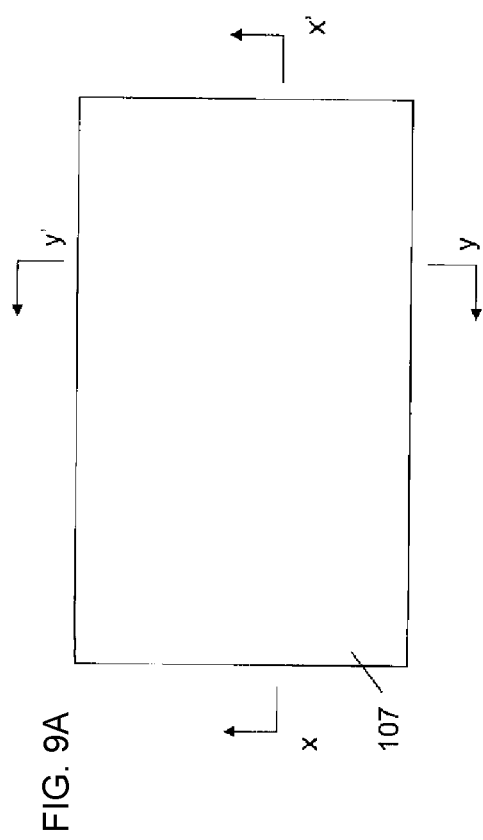
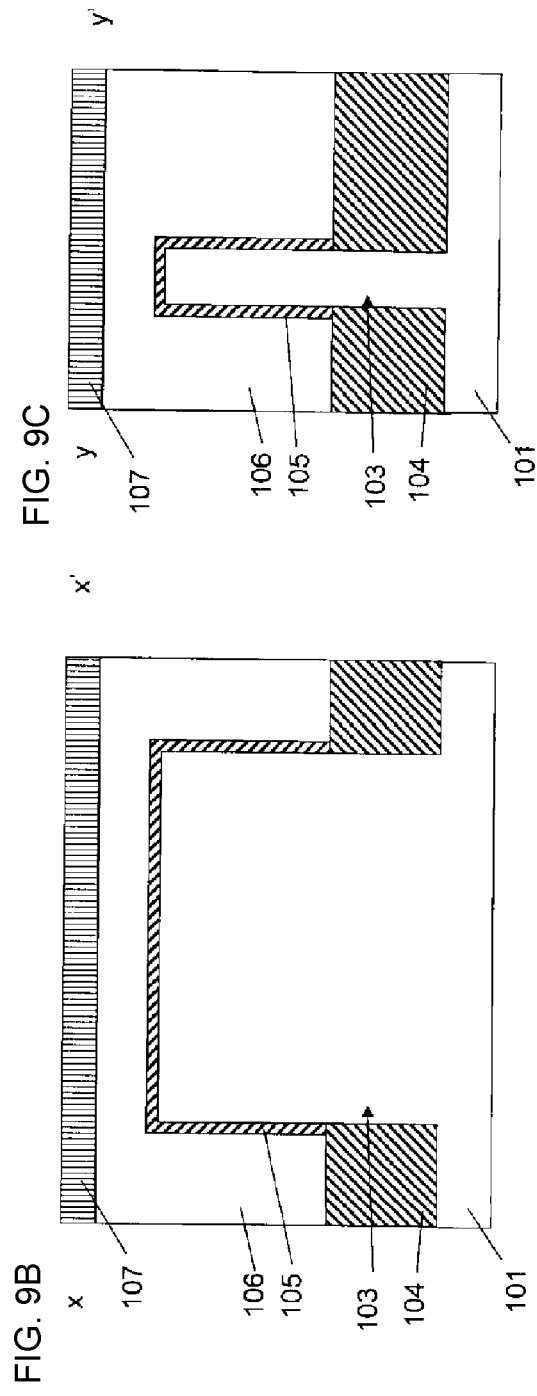
FIG. 9A
FIG. 9B
FIG. 9C

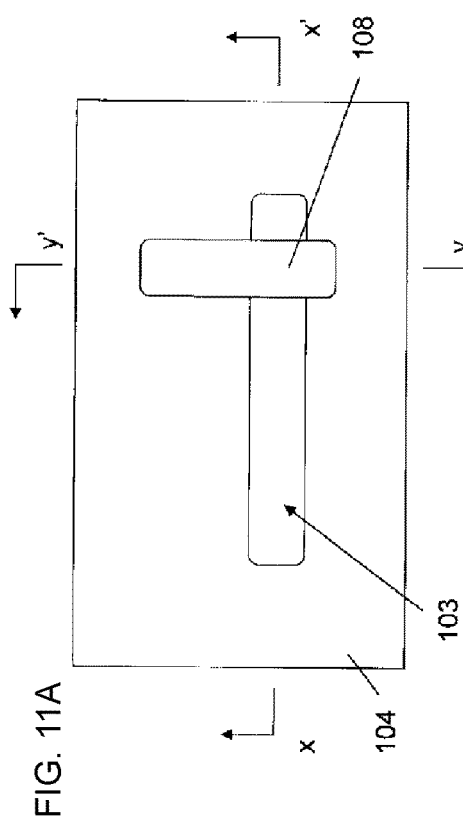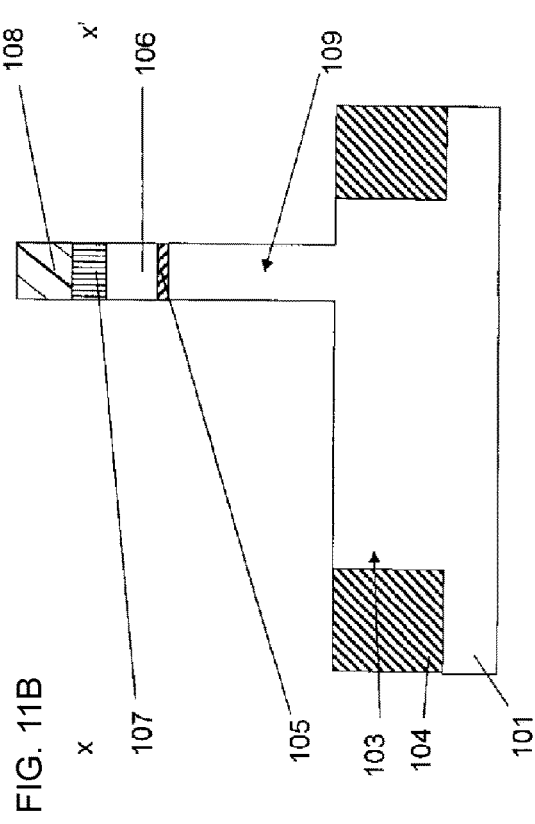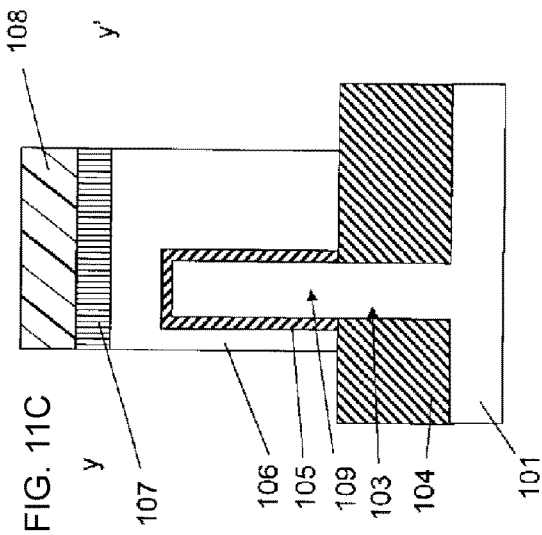

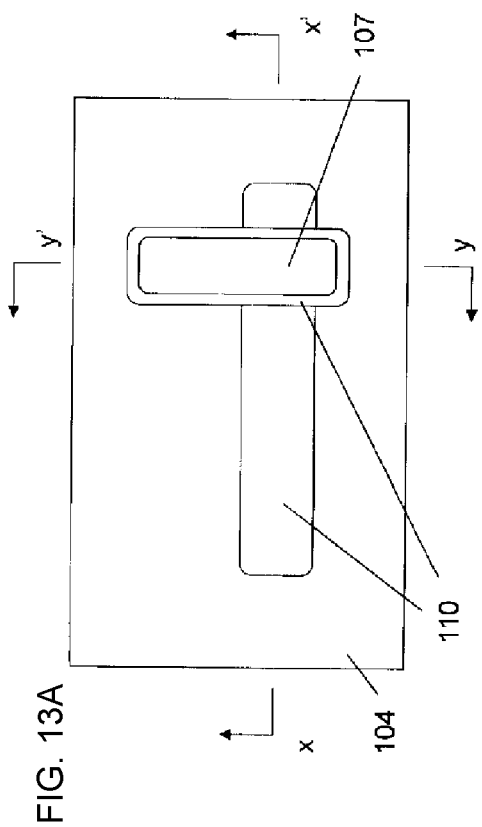
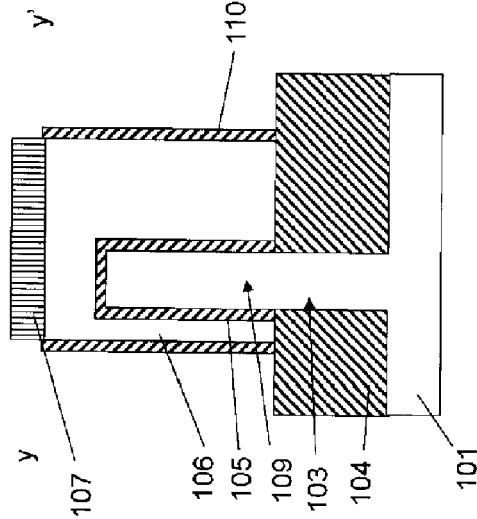
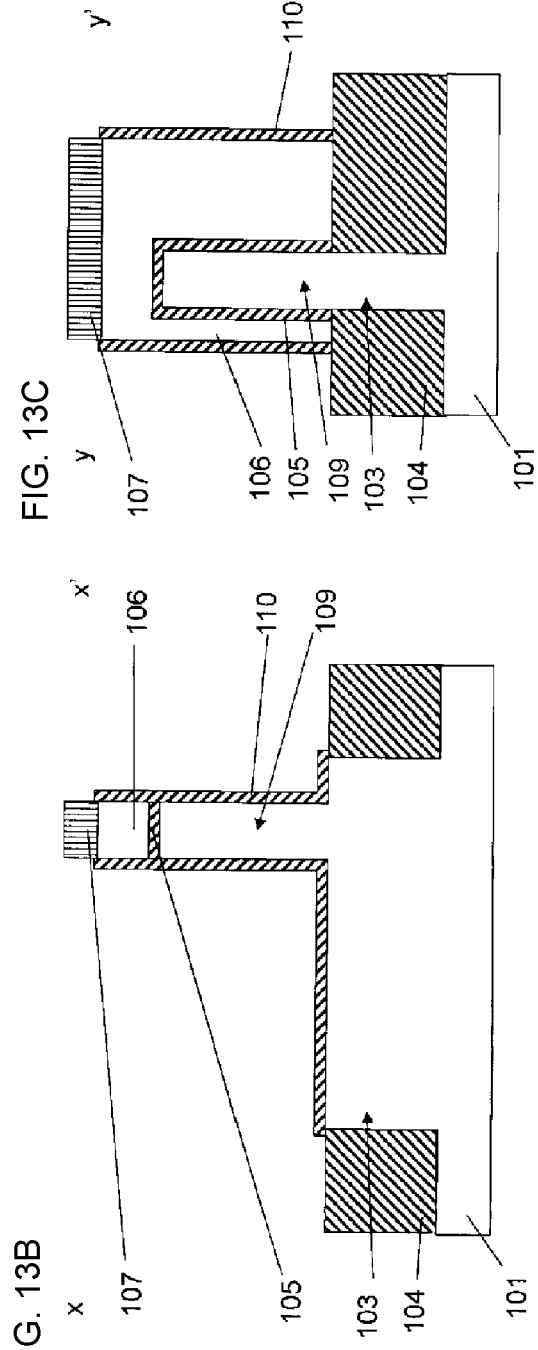
FIG. 13A
FIG. 13B
FIG. 13C

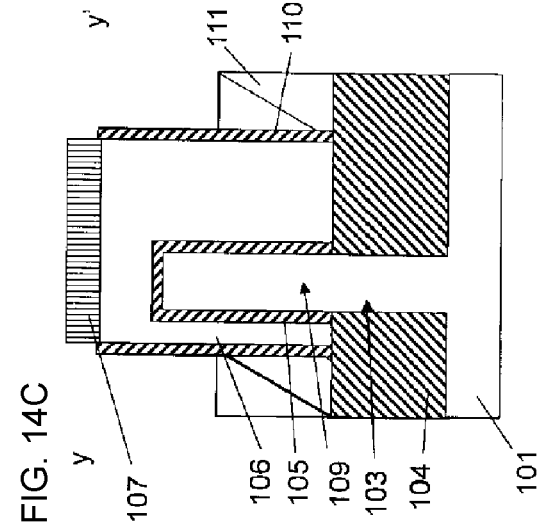
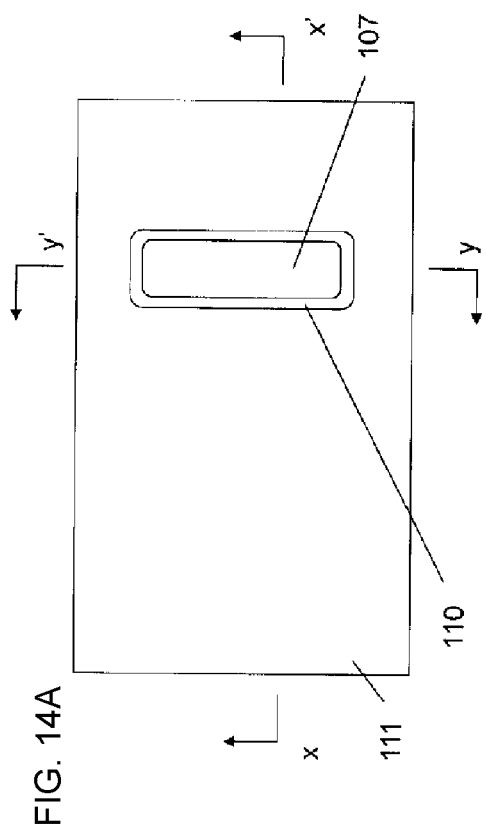
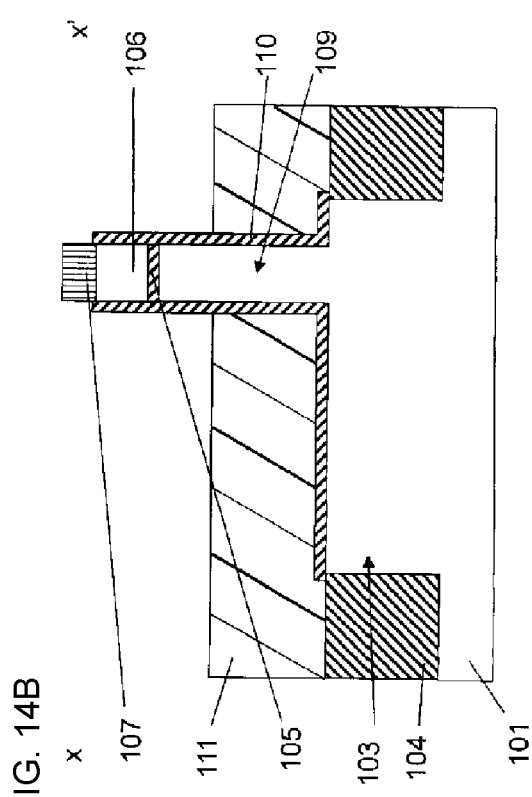

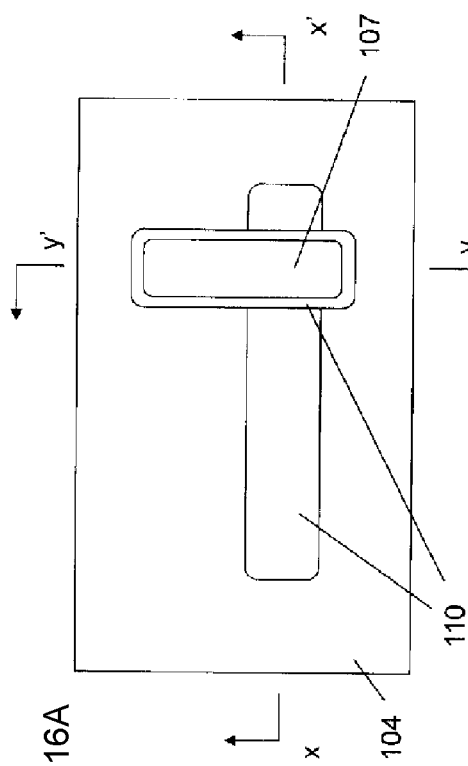
FIG. 16A
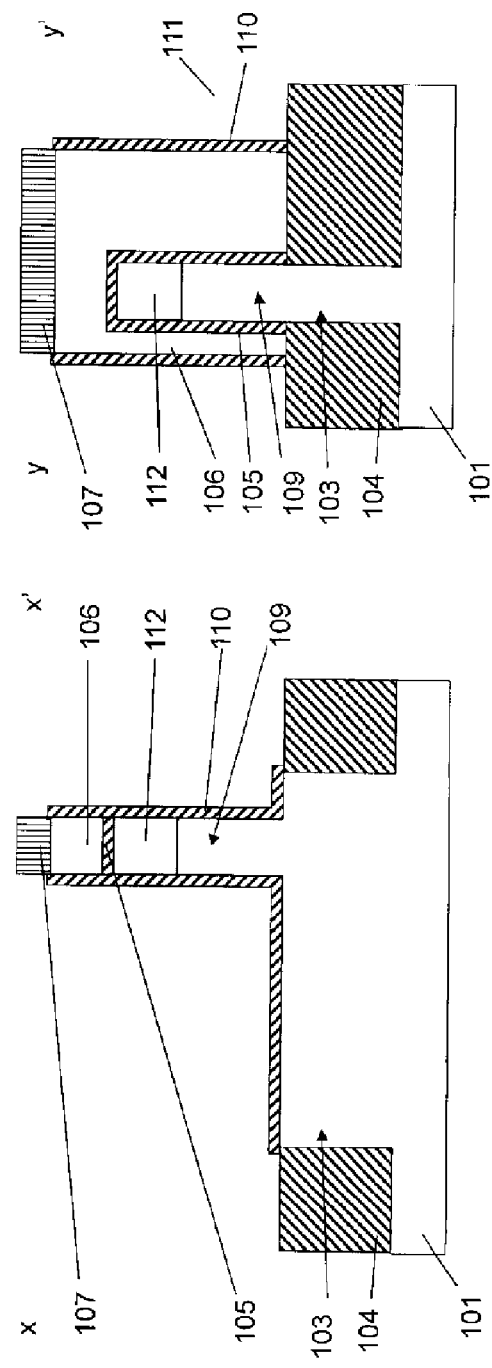
FIG. 16B
FIG. 16C

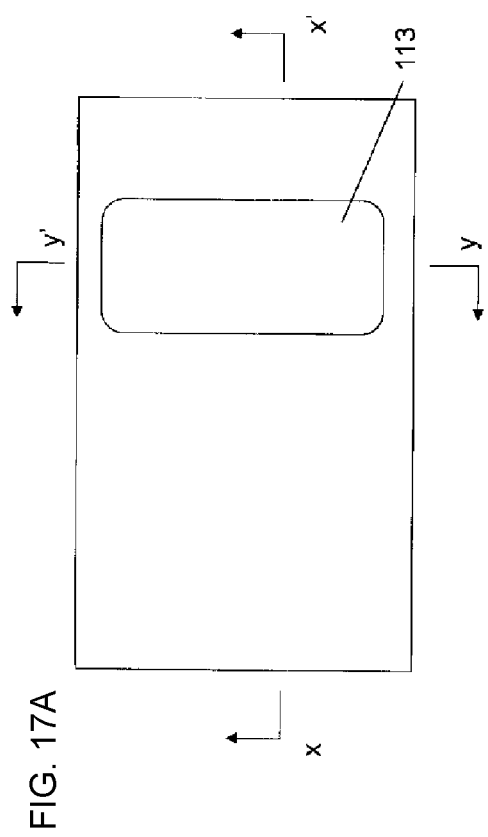
FIG. 17A
FIG. 17B
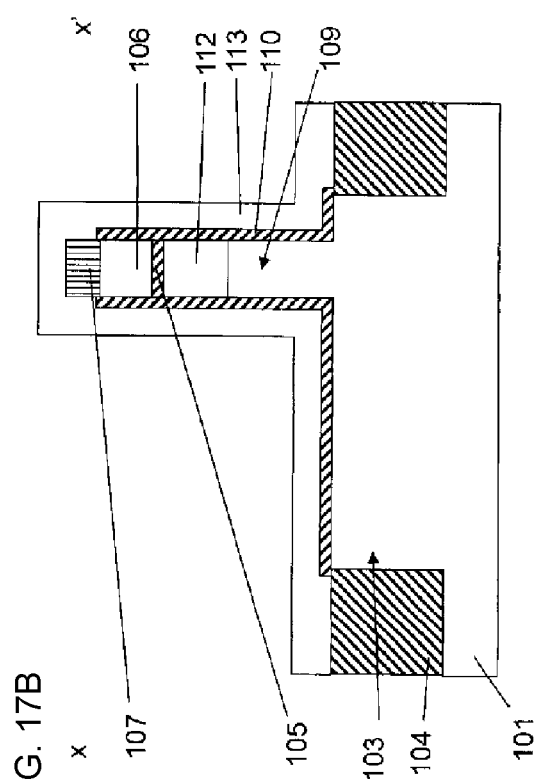
FIG. 17C

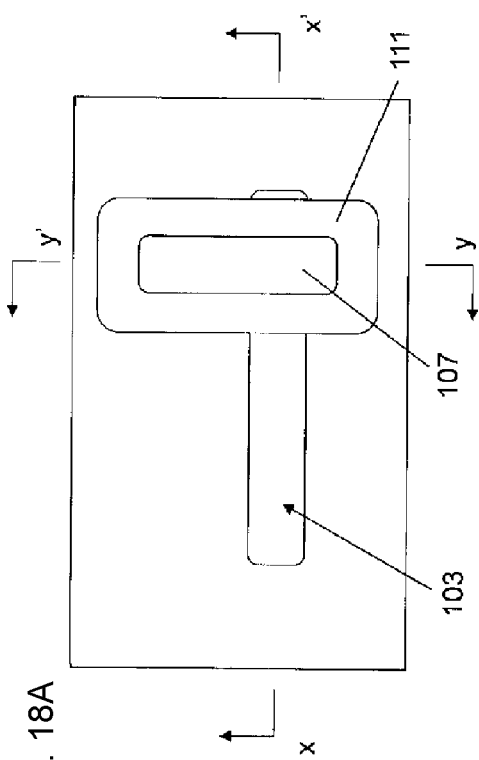
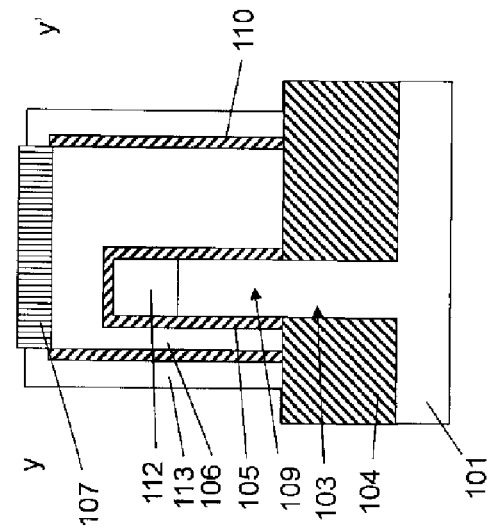
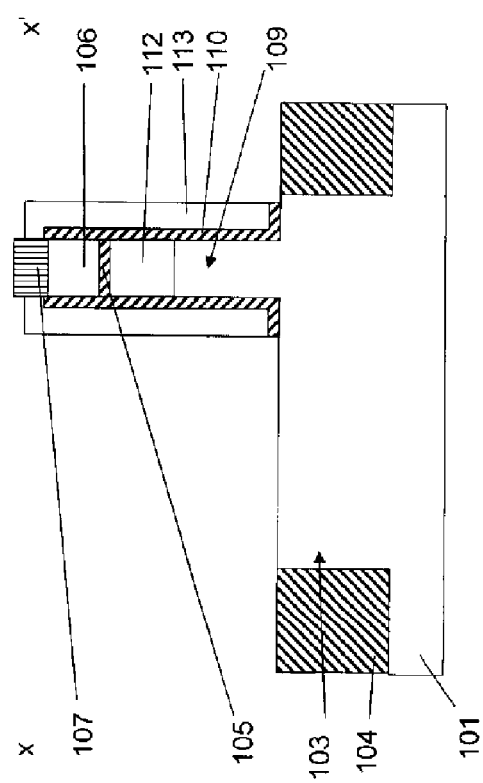
FIG. 18A
FIG. 18B
FIG. 18C

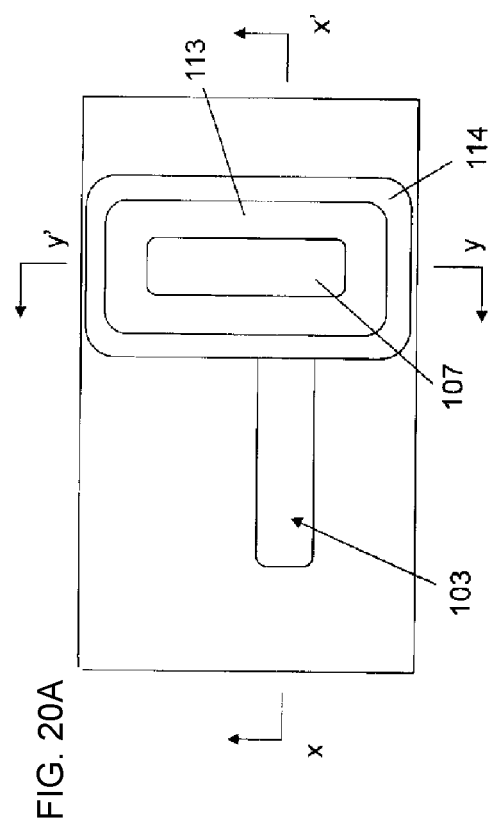
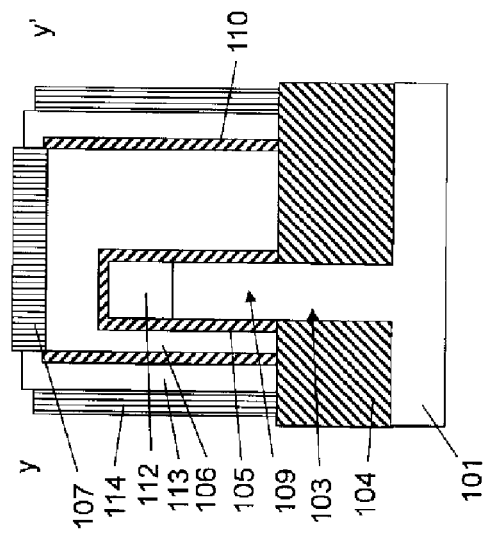
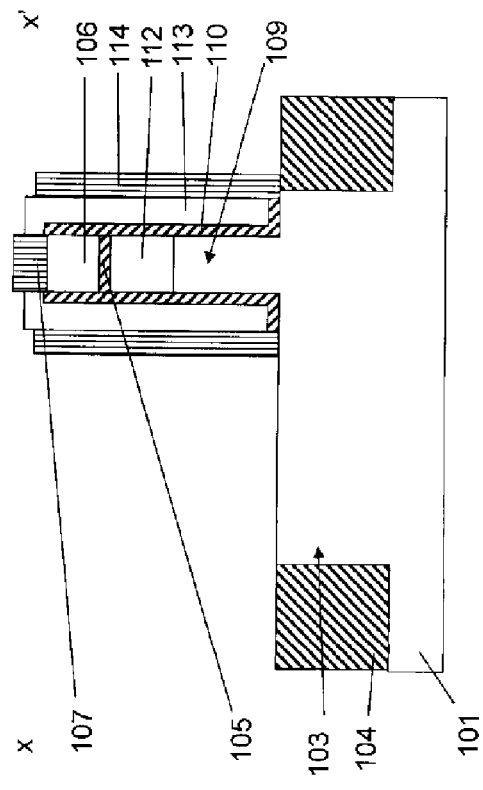

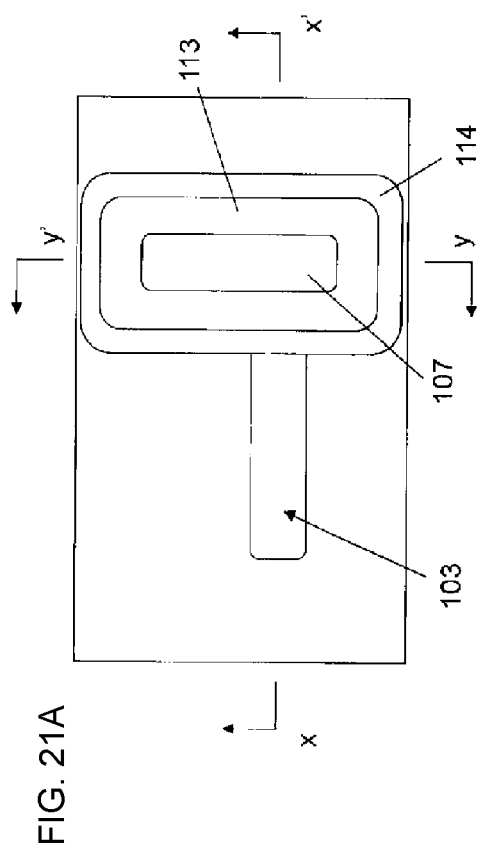
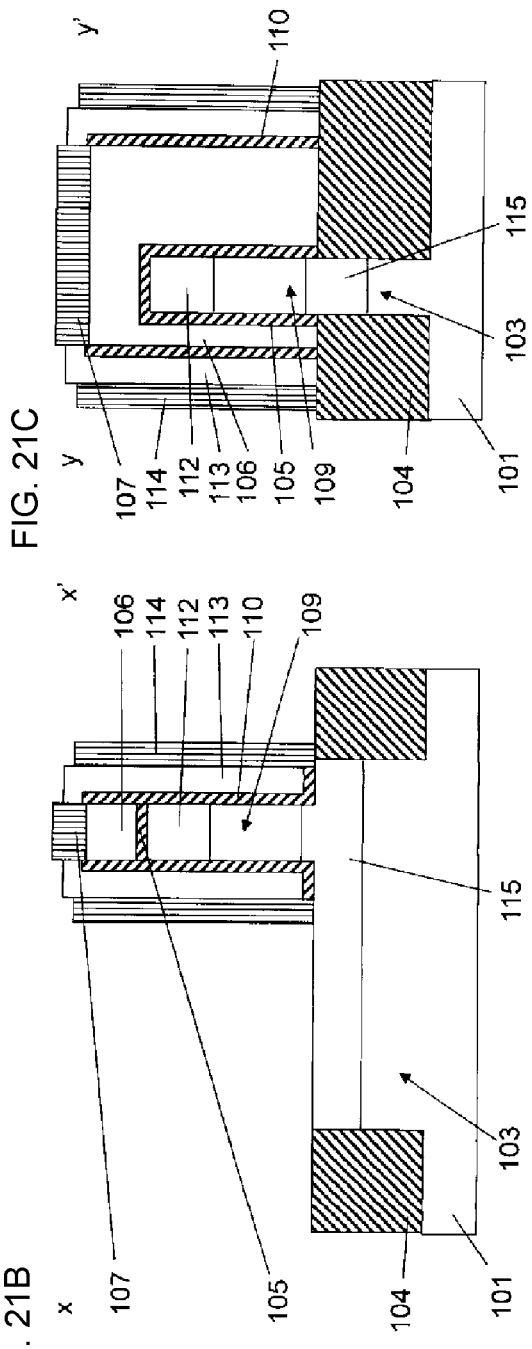

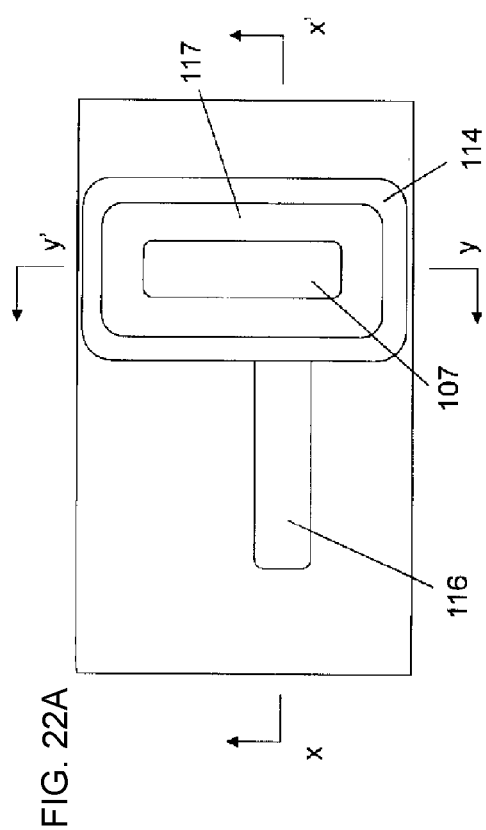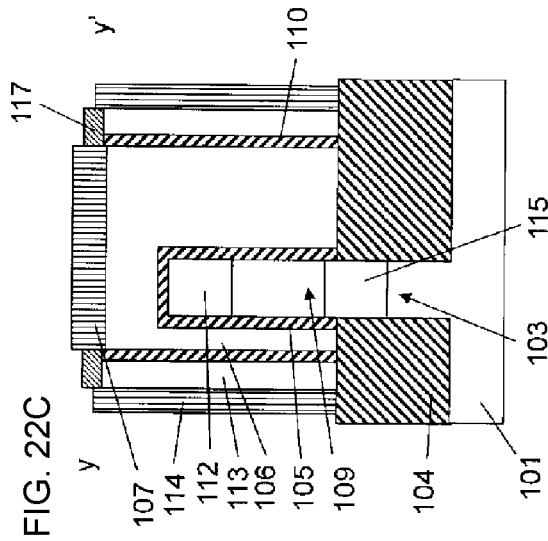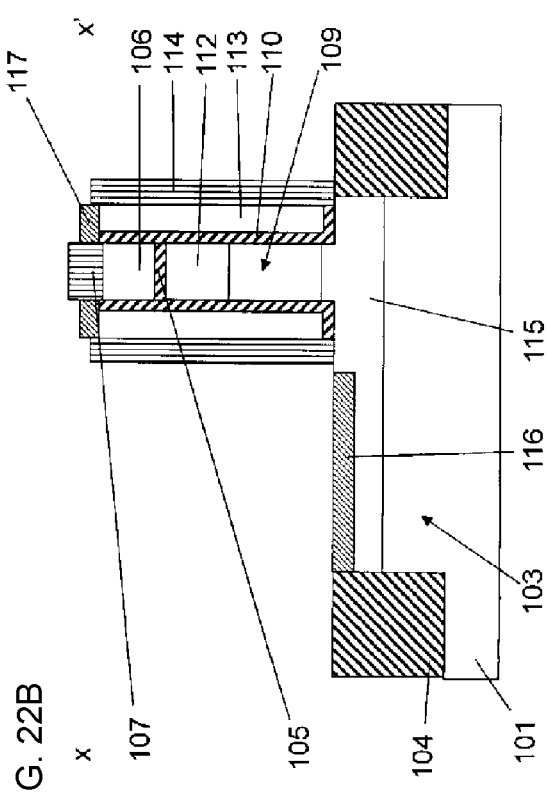

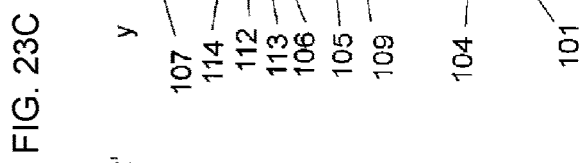
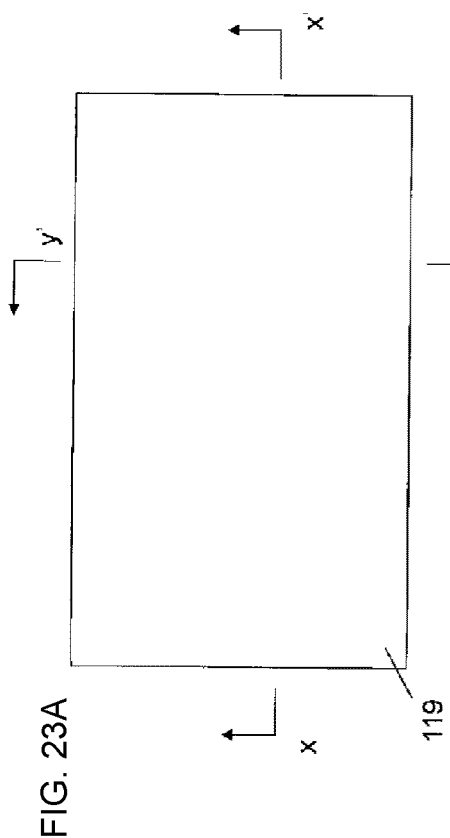
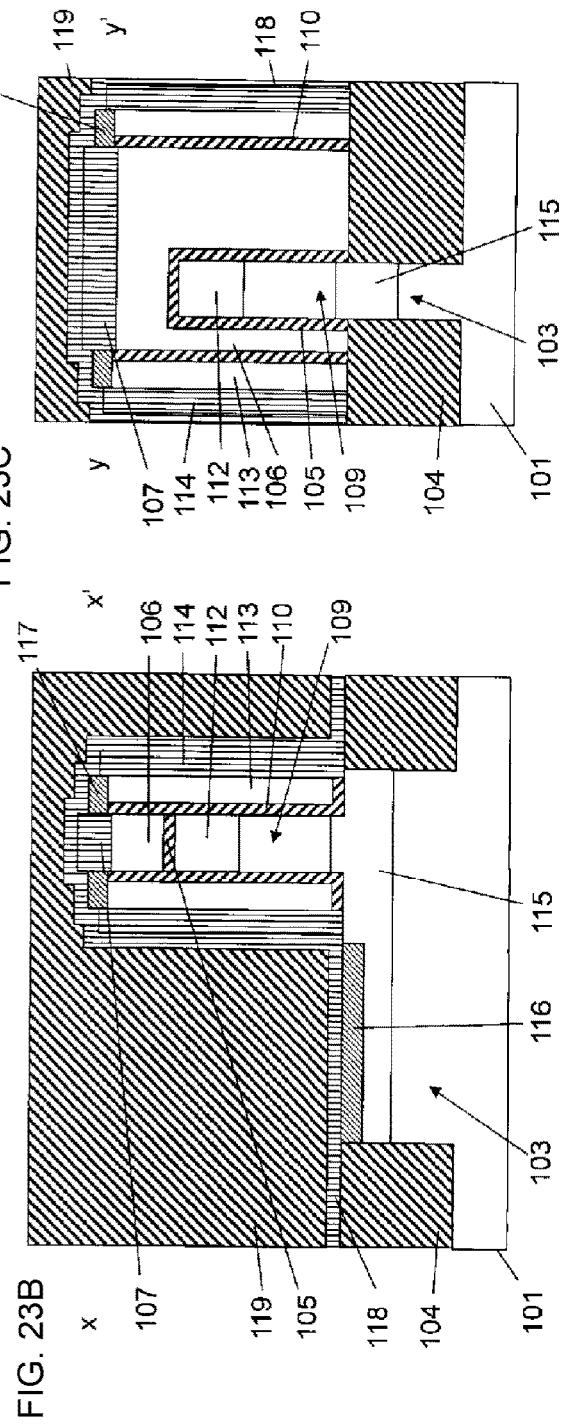

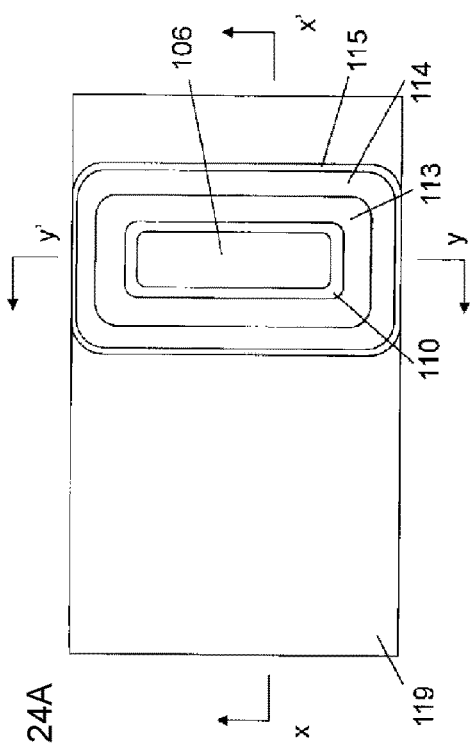
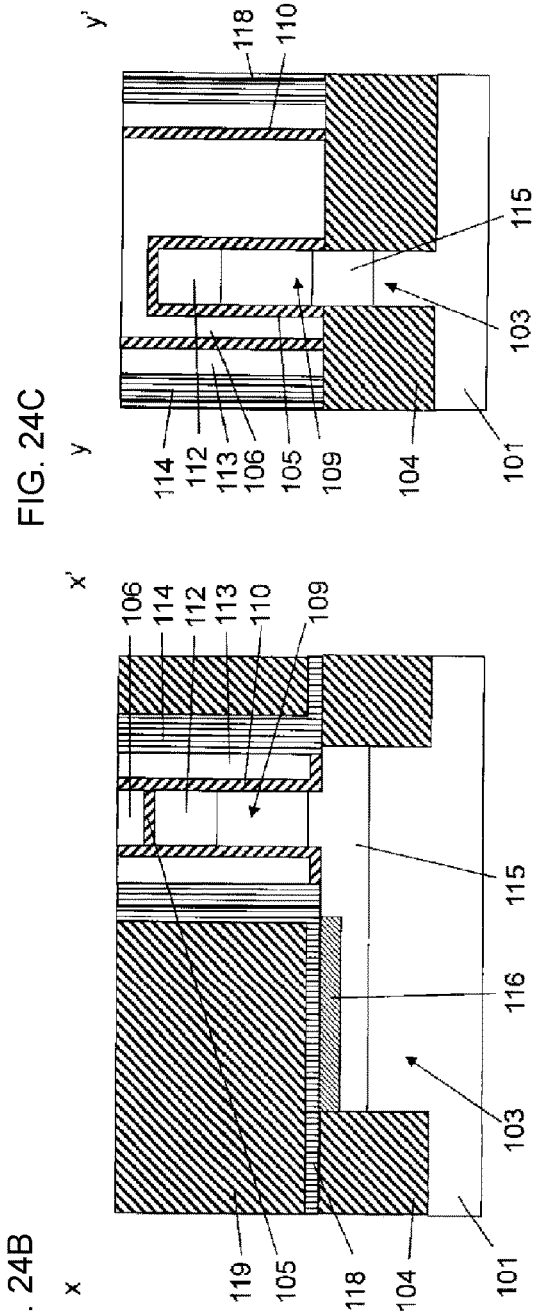
FIG. 24A
FIG. 24B
FIG. 24C

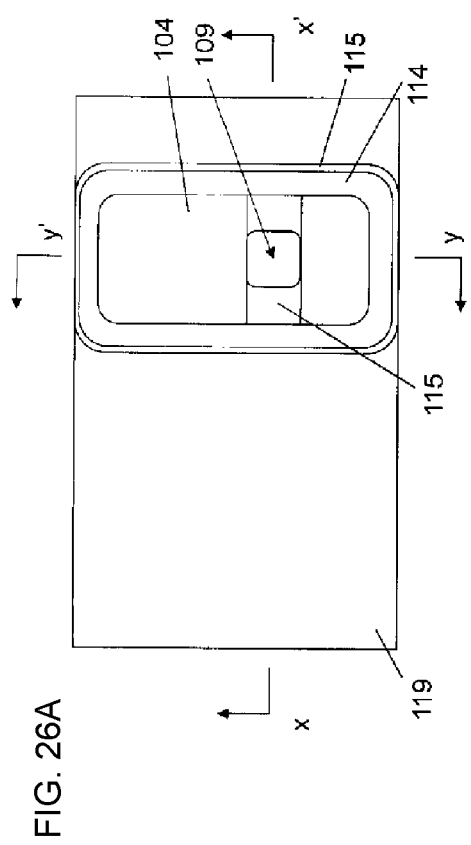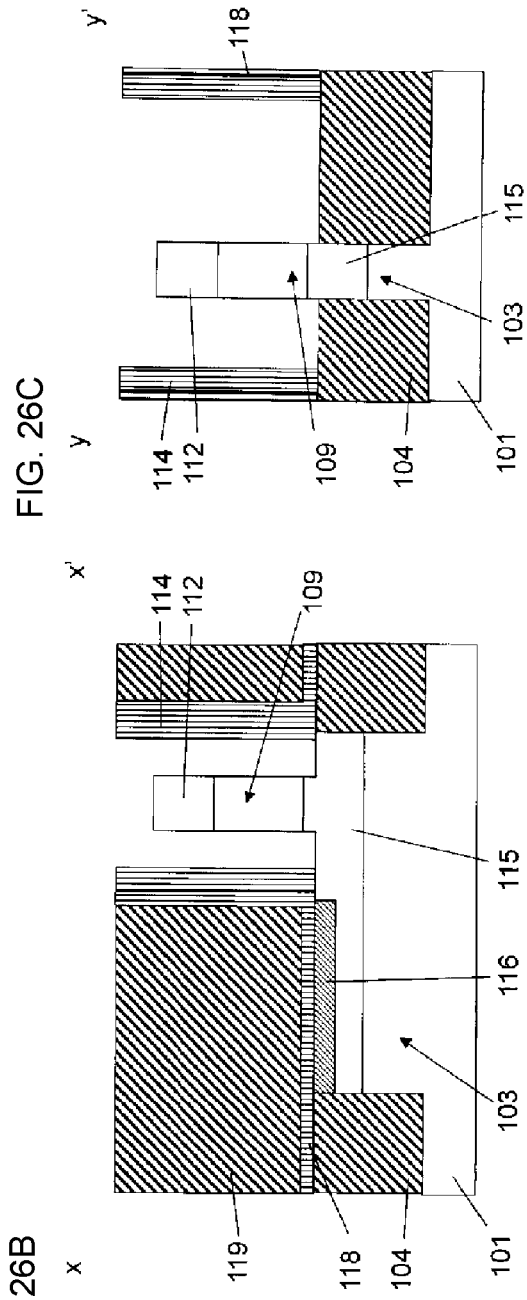
FIG. 26A
FIG. 26B
FIG. 26C

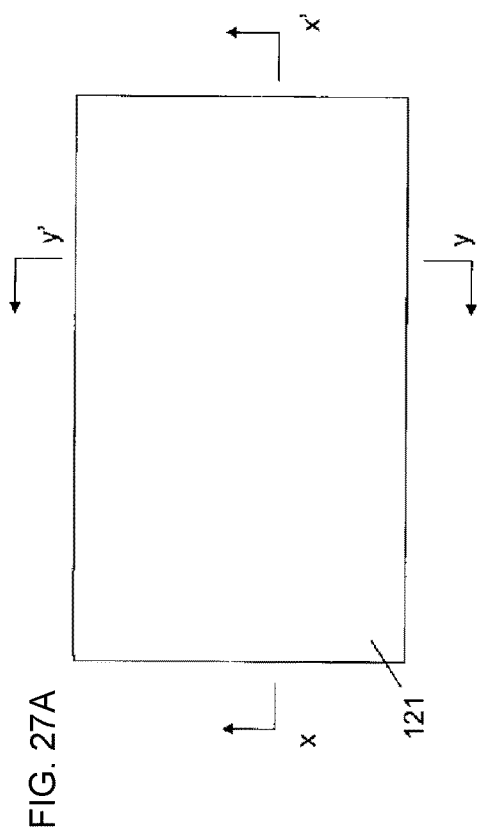
FIG. 27A
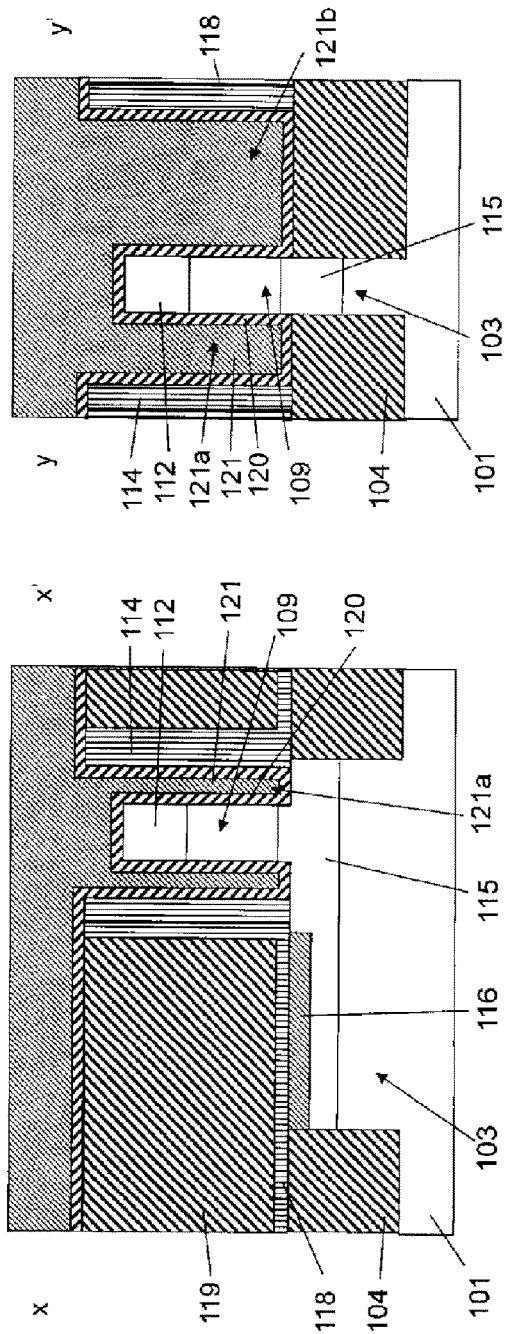
FIG. 27B
FIG. 27C

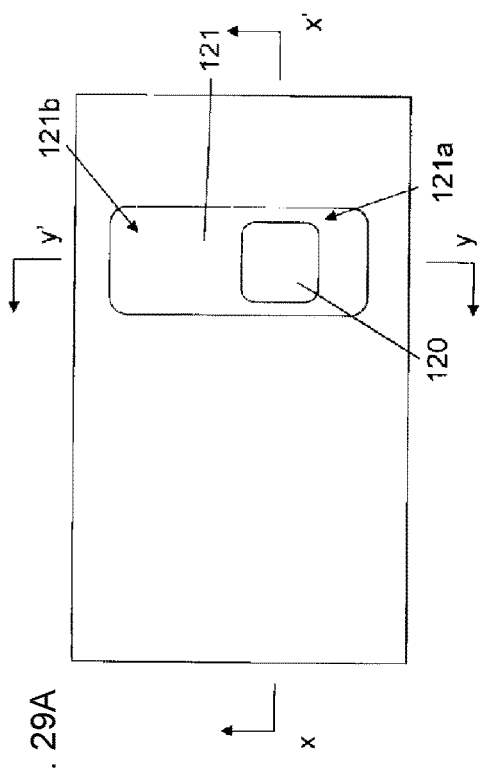
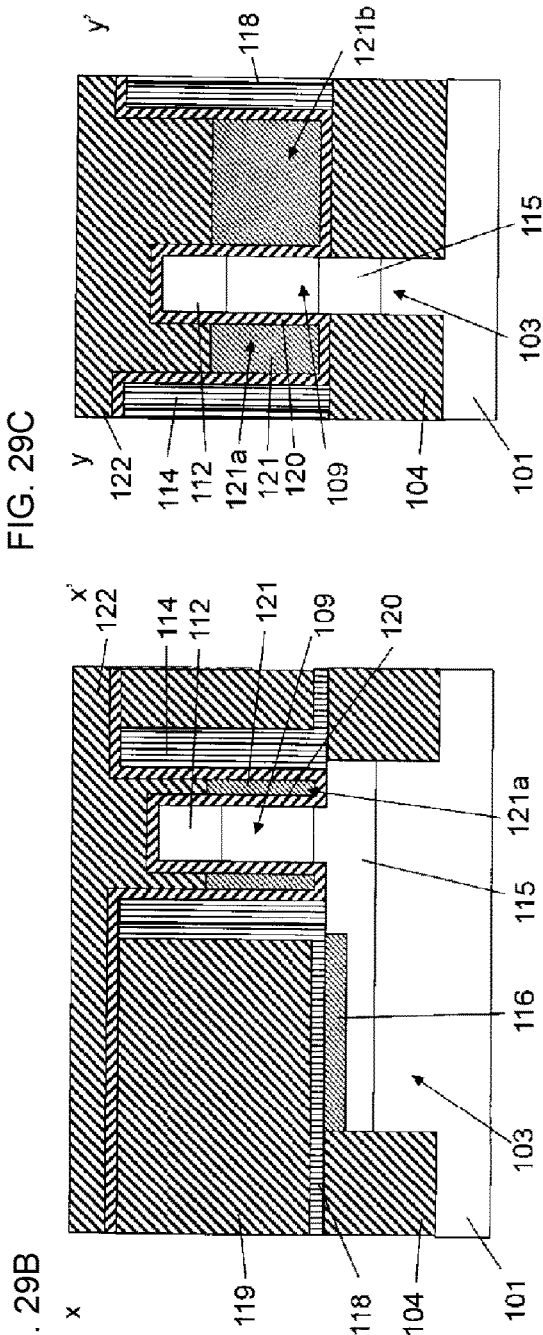
FIG. 29A
FIG. 29B
FIG. 29C

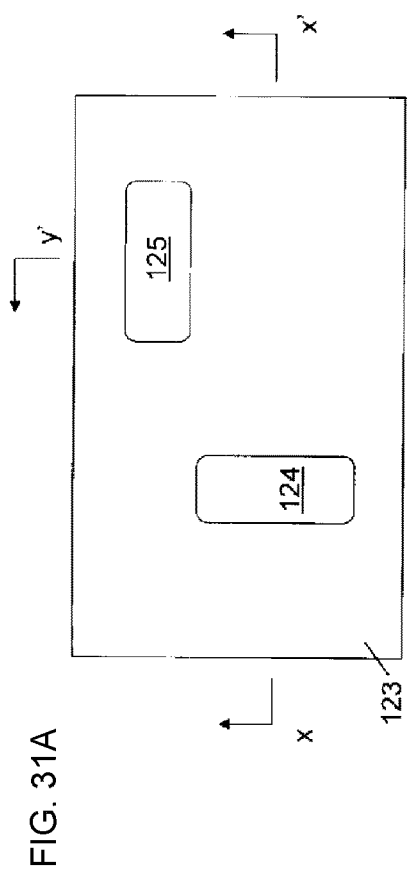
FIG. 31A
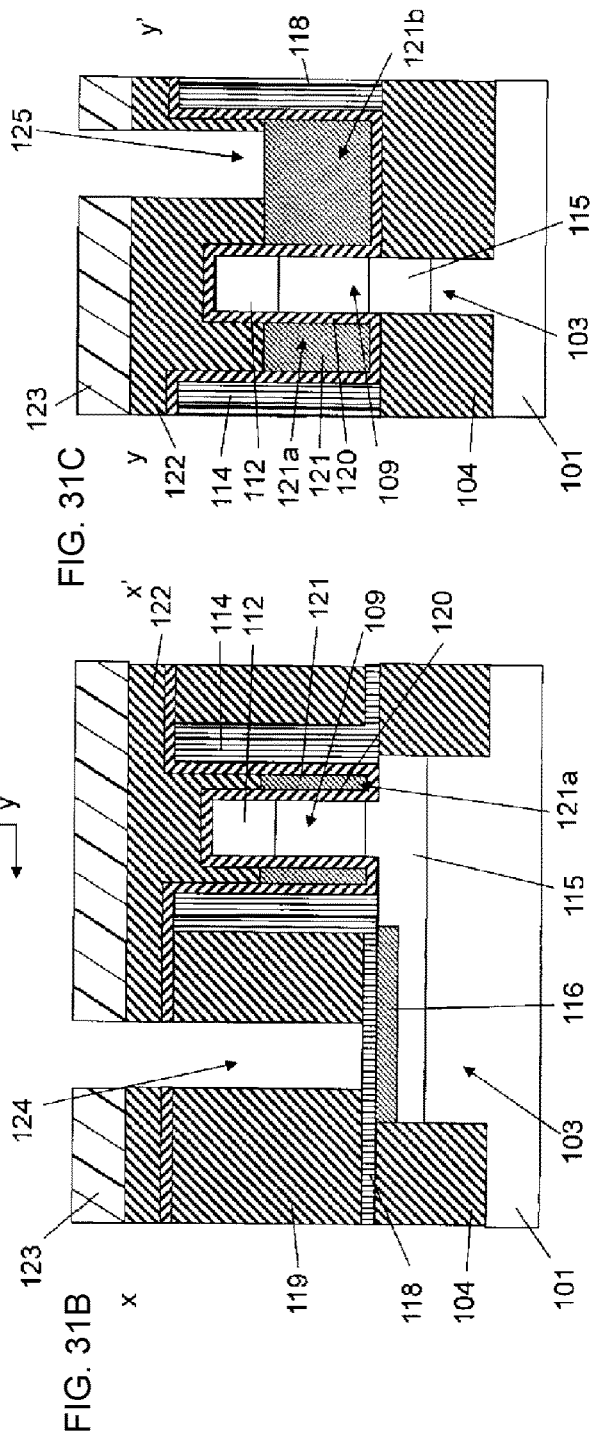
FIG. 31B
FIG. 31C

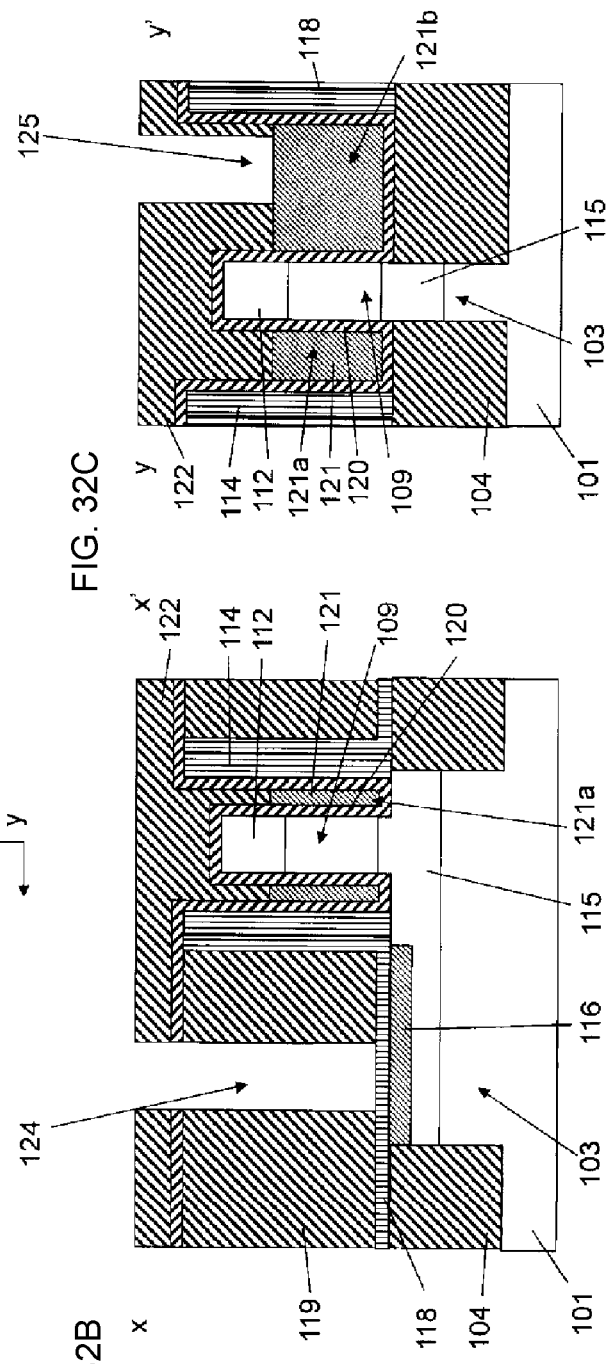

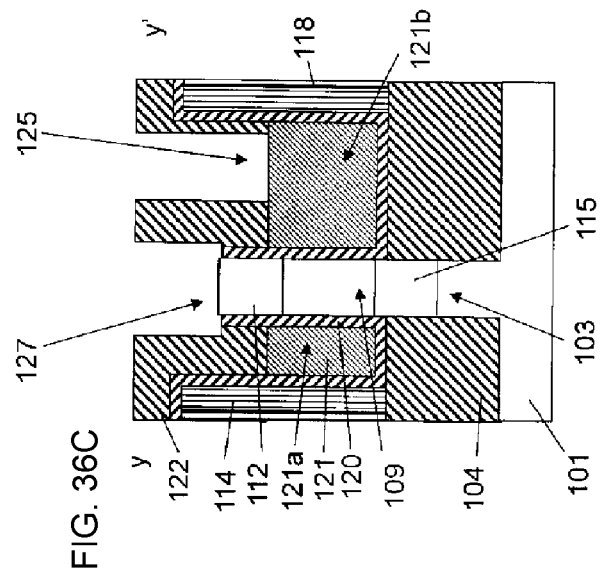
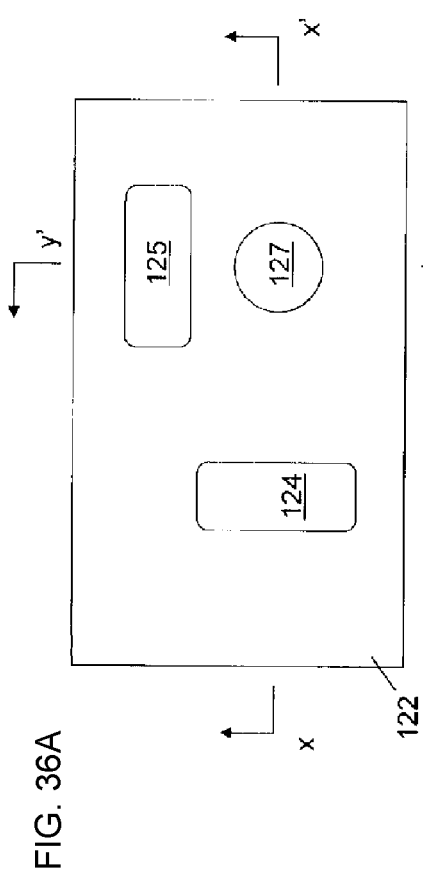
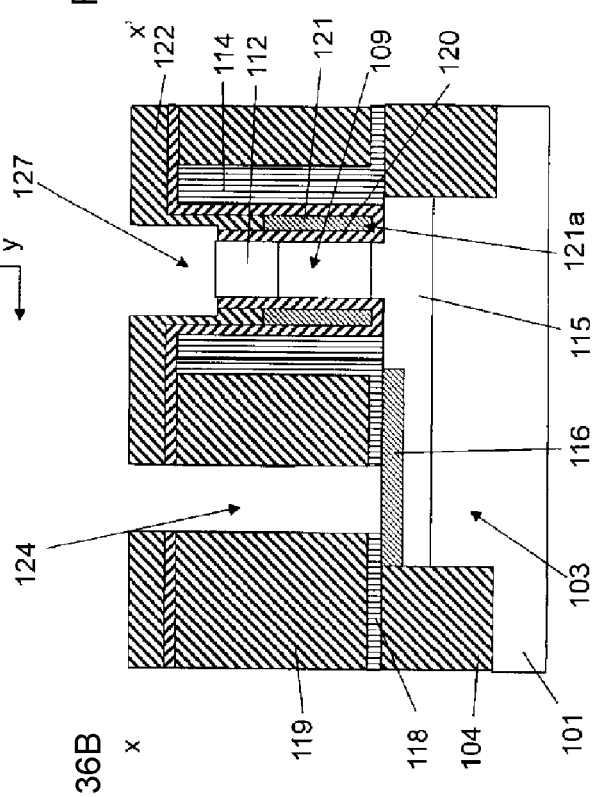
FIG. 36A
FIG. 36B
FIG. 36C

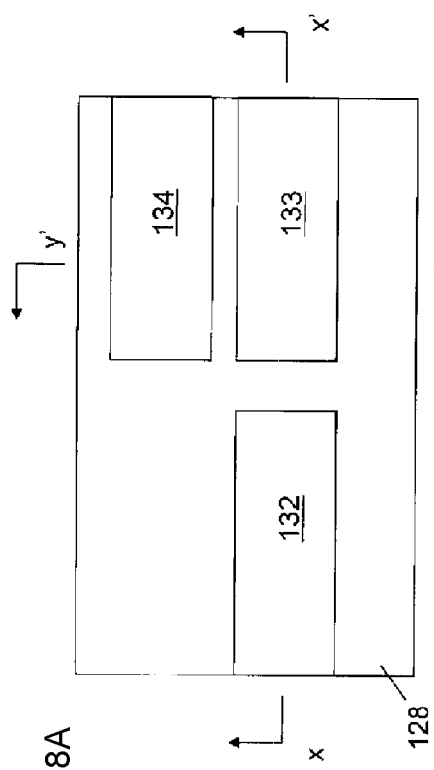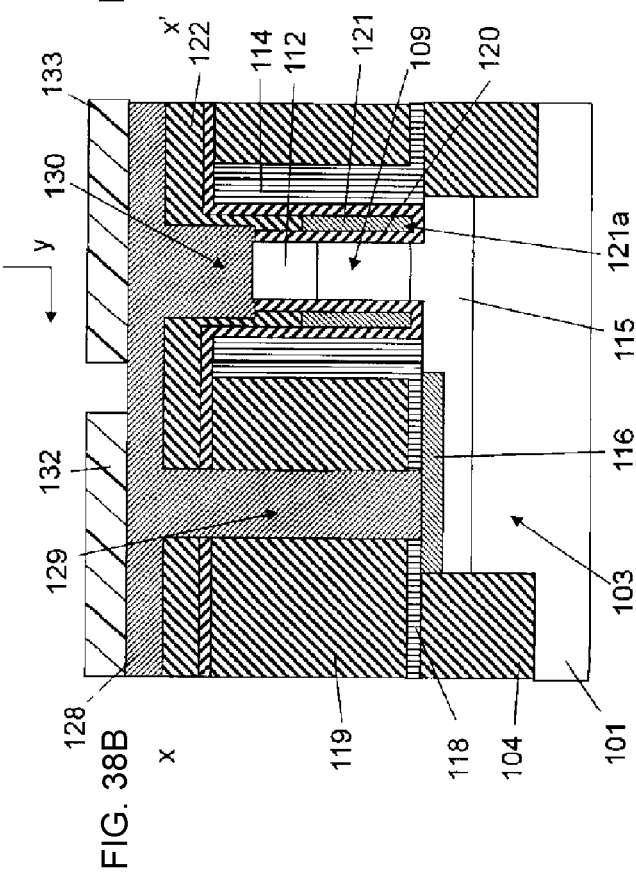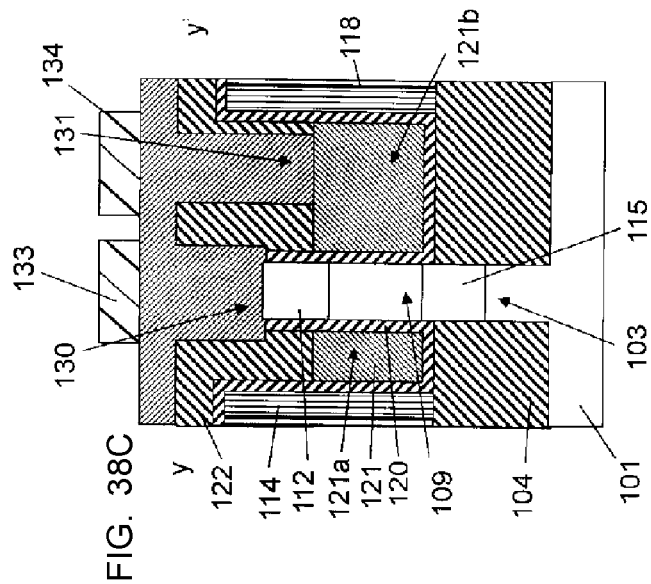
FIG. 38A
FIG. 38B
FIG. 38C

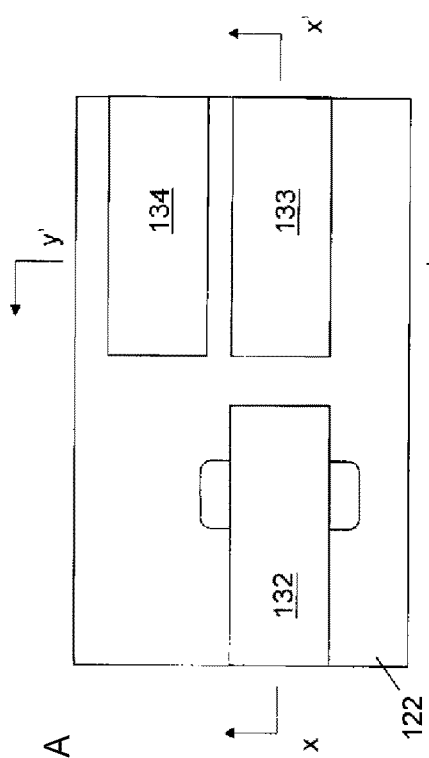
FIG. 39A
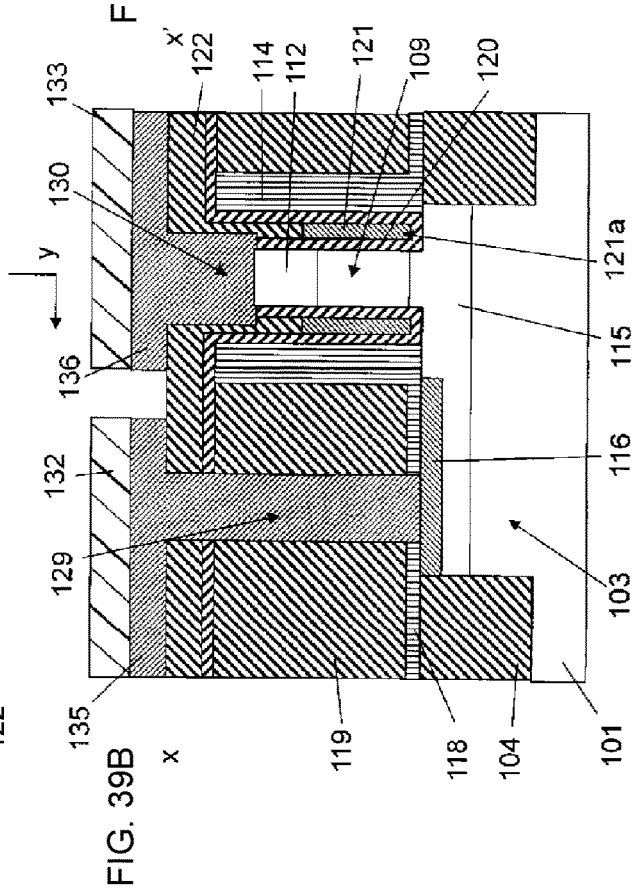
FIG. 39B
FIG. 39C

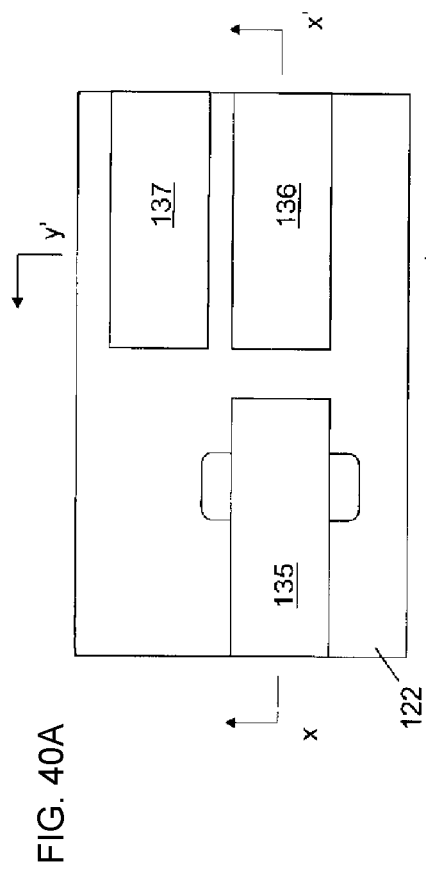
FIG. 40A
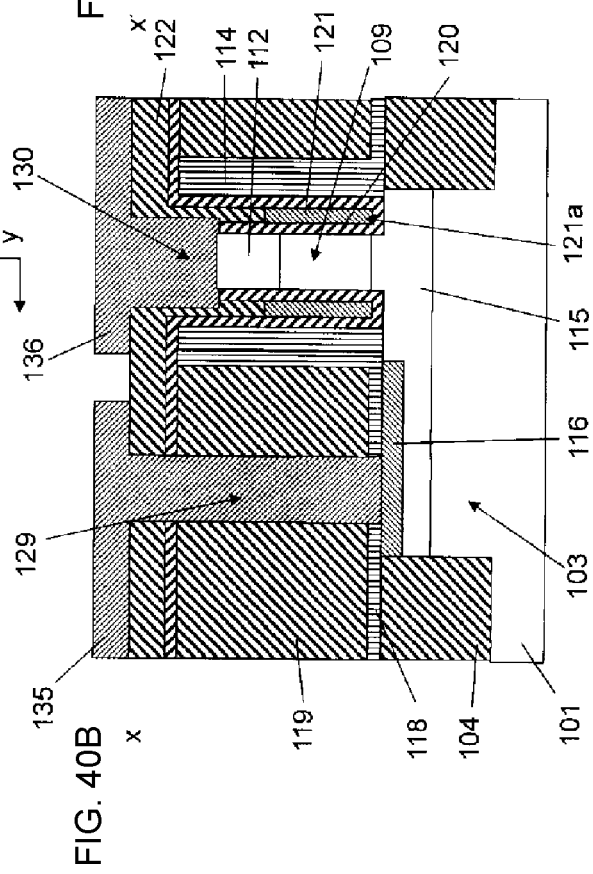
FIG. 40B
FIG. 40C

METHOD FOR PRODUCING SEMICONDUCTOR DEVICE

RELATED APPLICATIONS

The present application is divisional patent application of U.S. patent application Ser. No. 14/793,108, filed Jul. 7, 2015, which is a continuation application of PCT/JP2013/065998, filed Jun. 10, 2013, the entire contents of which are incorporated herein by reference.

BACKGROUND OF THE INVENTION

1. Field of the Invention

The present invention relates to a method for producing a semiconductor device and a semiconductor device.

2. Description of the Related Art

Semiconductor integrated circuits, in particular, integrated circuits that use MOS transistors, continue to achieve ever higher integration density. Due to increasing integration density, MOS transistors used therein have been miniaturized to a nanometer scale. Increasing miniaturization of MOS transistors renders it difficult to suppress leak current and a problem has arisen in which the area occupied by the circuit cannot be decreased while obtaining a required amount of current. In order to address this problem, a surrounding gate transistor (hereinafter referred to as an SGT) has been proposed, in which a source, a gate, and a drain are arranged in a direction perpendicular to the substrate and a gate electrode surrounds a pillar-shaped semiconductor layer (for example, refer to Japanese Unexamined Patent Application Publication Nos. 2-71556, 2-188966, and 3-145761).

According to a typical SGT production method, a silicon pillar having a pillar-shaped nitride film hard mask is formed by using a mask for lithographically forming a silicon pillar, a planar silicon layer is formed at a bottom of the silicon pillar by using a mask for lithographically forming a planar silicon layer, and a gate line is formed by using a mask for lithographically forming a gate line (for example, refer to Japanese Unexamined Patent Application Publication No. 2009-182317).

In other words, three masks are used to form a silicon pillar, a planar silicon layer, and a gate line.

A metal-gate-last process in which a metal gate is formed after a high-temperature process has been employed in actual production of typical MOS transistors in order to integrate a metal gate process and a high-temperature process (refer to IEDM 2007, K. Mistry et. al, pp 247-250). A gate is formed by using polysilicon, an interlayer insulating film is deposited, the polysilicon gate is exposed by chemical mechanical polishing and etched, and then a metal is deposited. Thus, a metal-gate-last process in which a metal gate is formed after a high-temperature process must be employed in making SGTs in order to integrate a metal gate process and a high-temperature process.

In order to decrease a parasitic capacitance between a gate line and a substrate, a first insulating film is used in a typical MOS transistor. For example, in a FINFET (refer to IEDM 2010, C C. Wu, et. al, 27.1.1-27.1.4), a first insulating film is formed around one fin-shaped semiconductor layer, and etched back to expose the fin-shaped semiconductor layer and decrease the parasitic capacitance between the gate line and the substrate. Thus, in SGTs also, a first insulating film must be used in order to decrease the parasitic capacitance between the gate line and the substrate. Since an SGT includes a pillar-shaped semiconductor layer in addition to a fin-shaped semiconductor layer, some consideration is necessary to form a pillar-shaped semiconductor layer.

SUMMARY OF THE INVENTION

An object of the present invention is to provide a method for producing an SGT through a gate-last process in which two masks are used to form a fin-shaped semiconductor layer, a pillar-shaped semiconductor layer, a gate electrode, and a gate line, and an SGT structure obtained by the method.

A first aspect of the invention provides a method for producing a semiconductor device. The method includes a first step of forming a fin-shaped semiconductor layer on a semiconductor substrate and forming a first insulating film around the fin-shaped semiconductor layer and a second step following the first step. The second step includes forming a second insulating film around the fin-shaped semiconductor layer, depositing a first polysilicon on the second insulating film to conduct planarization, forming a second resist for forming a gate line and a pillar-shaped semiconductor layer so that the second resist extends in a direction perpendicular to a direction in which the fin-shaped semiconductor layer extends, and etching the first polysilicon, the second insulating film, and the fin-shaped semiconductor layer to form a pillar-shaped semiconductor layer and a first dummy gate formed of the first polysilicon.

The second step may further include, after depositing the first polysilicon on the second insulating film to conduct planarization, forming a third insulating film on the first polysilicon.

The method may further include a third step following the second step, the third step including forming a fourth insulating film around the pillar-shaped semiconductor layer and the first dummy gate, depositing a second polysilicon around the fourth insulating film, and performing etching so that the second polysilicon remains on side walls of the first dummy gate and the pillar-shaped semiconductor layer and forms a second dummy gate.

The third step may further include, after forming the fourth insulating film around the pillar-shaped semiconductor layer and the first dummy gate, forming a third resist, etching back the third resist to expose an upper portion of the pillar-shaped semiconductor layer, and forming a first diffusion layer in the upper portion of the pillar-shaped semiconductor layer.

The method may further include a fourth step that includes forming a fifth insulating film around the second dummy gate, etching the fifth insulating film to have a side wall shape so as to form a side wall formed of the fifth insulating film, forming a second diffusion layer in an upper portion of the fin-shaped semiconductor layer and a lower portion of the pillar-shaped semiconductor layer, and forming a metal-semiconductor compound on the second diffusion layer.

The method may further include a fifth step following the fourth step, the fifth step including depositing a contact stopper film, depositing an interlayer insulating film and performing chemical mechanical polishing to expose an upper portion of the second dummy gate and an upper portion of the first dummy gate, removing the second dummy gate and the first dummy gate, removing the second insulating film and the fourth insulating film, forming a gate insulating film around the pillar-shaped semiconductor layer and on inner sides of the fifth insulating film, depositing a metal, and performing etch-back to form a gate electrode and a gate line.

A second aspect of the present invention provides a semiconductor device that includes a fin-shaped semiconductor layer disposed on a semiconductor substrate; a first insulating film disposed around the fin-shaped semiconductor layer; a pillar-shaped semiconductor layer disposed around the fin-shaped semiconductor layer; a gate insulating film disposed around the pillar-shaped semiconductor layer; a gate electrode formed of a metal and disposed around the gate insulating film; a gate line connected to the gate electrode and formed of a metal extending in a direction perpendicular to a direction in which the fin-shaped semiconductor layer extends; a first diffusion layer disposed in an upper portion of the pillar-shaped semiconductor layer; and a second diffusion layer disposed in an upper portion of the fin-shaped semiconductor layer and a lower portion of the pillar-shaped semiconductor layer. A width of the pillar-shaped semiconductor layer in a direction perpendicular to a direction in which the fin-shaped semiconductor layer extends is equal to a width of the fin-shaped semiconductor layer in the direction perpendicular to the direction in which the fin-shaped semiconductor layer extends. The gate insulating film is disposed around and at bottoms of gate electrode and the gate line, and an outer width of the gate electrode is equal to a width of the gate line.

According to the present invention, a method for producing an SGT through a gate-last process in which two masks are used to form a fin-shaped semiconductor layer, a pillar-shaped semiconductor layer, a gate electrode, and a gate line, and an SGT structure obtained by the method can be provided.

Since the method includes a first step of forming a fin-shaped semiconductor layer on a semiconductor substrate and forming a first insulating film around the fin-shaped semiconductor layer; a second step following the first step and including forming a second insulating film around the fin-shaped semiconductor layer, depositing a first polysilicon on the second insulating film to conduct planarization, forming a second resist for forming a gate line and a pillar-shaped semiconductor layer so that the second resist extends in a direction perpendicular to a direction in which the fin-shaped semiconductor layer extends, and etching the first polysilicon, the second insulating film, and the fin-shaped semiconductor layer to form a pillar-shaped semiconductor layer and a first dummy gate formed of the first polysilicon; and a third step including forming a fourth insulating film around the pillar-shaped semiconductor layer and the first dummy gate, depositing a second polysilicon around the fourth insulating film, and performing etching so that the second polysilicon remains on side walls of the first dummy gate and the pillar-shaped semiconductor layer and forms a second dummy gate, a fin-shaped semiconductor layer, a pillar-shaped semiconductor layer, and first and second dummy gates which later form a gate electrode and a gate line can be formed by using two masks and thus the number of required steps can be decreased.

Misalignment between a pillar-shaped semiconductor layer and a gate line can be eliminated.

Since an existing metal-gate-last production process can be employed which involves forming first and second dummy gates by using polysilicon, depositing an interlayer insulating film, exposing the first and second dummy gates by chemical mechanical polishing, etching the polysilicon gates, and then depositing metal, a metal gate SGT can be easily produced.

Moreover, the gate insulating film disposed around and at bottoms of the gate electrode and the gate line can insulate the gate electrode and the gate line from the pillar-shaped semiconductor layer and the fin-shaped semiconductor layer.

BRIEF DESCRIPTION OF THE DRAWINGS

FIG. 1A is a plan view of a semiconductor device according to an embodiment, FIG. 1B is a cross-sectional view taken along line x-x' in FIG. 1A, and FIG. 1C is a cross-sectional view taken along line y-y' in FIG. 1A.

FIG. 2A is a plan view related to a method for producing a semiconductor device according to an embodiment, FIG. 2B is a cross-sectional view taken along line x-x' in FIG. 2A, and FIG. 2C is a cross-sectional view taken along line y-y' in FIG. 2A.

FIG. 3A is a plan view related to the method for producing a semiconductor device according to an embodiment, FIG. 3B is a cross-sectional view taken along line x-x' in FIG. 3A, and FIG. 3C is a cross-sectional view taken along line y-y' in FIG. 3A.

FIG. 6A is a plan view related to the method for producing a semiconductor device according to an embodiment, FIG. 6B is a cross-sectional view taken along line x-x' in FIG. 6A, and FIG. 6C is a cross-sectional view taken along line y-y' in FIG. 6A.

FIG. 8A is a plan view related to the method for producing a semiconductor device according to an embodiment, FIG. 8B is a cross-sectional view taken along line x-x' in FIG. 8A, and FIG. 8C is a cross-sectional view taken along line y-y' in FIG. 8A.

FIG. 9A is a plan view related to the method for producing a semiconductor device according to an embodiment, FIG. 9B is a cross-sectional view taken along line x-x' in FIG. 9A, and FIG. 9C is a cross-sectional view taken along line y-y' in FIG. 9A.

FIG. 11A is a plan view related to the method for producing a semiconductor device according to an embodiment, FIG. 11B is a cross-sectional view taken along line x-x' in FIG. 11A, and FIG. 11C is a cross-sectional view taken along line y-y' in FIG. 11A.

FIG. 13A is a plan view related to the method for producing a semiconductor device according to an embodiment, FIG. 13B is a cross-sectional view taken along line x-x' in FIG. 13A, and FIG. 13C is a cross-sectional view taken along line y-y' in FIG. 13A.

FIG. 14A is a plan view related to the method for producing a semiconductor device according to an embodiment, FIG. 14B is a cross-sectional view taken along line x-x' in FIG. 14A, and FIG. 14C is a cross-sectional view taken along line y-y' in FIG. 14A.

FIG. 16A is a plan view related to the method for producing a semiconductor device according to an embodiment, FIG. 16B is a cross-sectional view taken along line x-x' in FIG. 16A, and FIG. 16C is a cross-sectional view taken along line y-y' in FIG. 16A.

FIG. 17A is a plan view related to the method for producing a semiconductor device according to an embodiment, FIG. 17B is a cross-sectional view taken along line x-x' in FIG. 17A, and FIG. 17C is a cross-sectional view taken along line y-y' in FIG. 17A.

FIG. 18A is a plan view related to the method for producing a semiconductor device according to an embodiment, FIG. 18B is a cross-sectional view taken along line x-x' in FIG. 18A, and FIG. 18C is a cross-sectional view taken along line y-y' in FIG. 18A.

FIG. 20A is a plan view related to the method for producing a semiconductor device according to an embodiment, FIG. 20B is a cross-sectional view taken along line x-x' in FIG. 20A, and FIG. 20C is a cross-sectional view taken along line y-y' in FIG. 20A.

FIG. 21A is a plan view related to the method for producing a semiconductor device according to an embodiment, FIG. 21B is a cross-sectional view taken along line x-x' in FIG. 21A, and FIG. 21C is a cross-sectional view taken along line y-y' in FIG. 21A.

FIG. 22A is a plan view related to the method for producing a semiconductor device according to an embodiment, FIG. 22B is a cross-sectional view taken along line x-x' in FIG. 22A, and FIG. 22C is a cross-sectional view taken along line y-y' in FIG. 22A.

FIG. 23A is a plan view related to the method for producing a semiconductor device according to an embodiment, FIG. 23B is a cross-sectional view taken along line x-x' in FIG. 23A, and FIG. 23C is a cross-sectional view taken along line y-y' in FIG. 23A.

FIG. 24A is a plan view related to the method for producing a semiconductor device according to an embodiment, FIG. 24B is a cross-sectional view taken along line x-x' in FIG. 24A, and FIG. 24C is a cross-sectional view taken along line y-y' in FIG. 24A.

FIG. 26A is a plan view related to the method for producing a semiconductor device according to an embodiment, FIG. 26B is a cross-sectional view taken along line x-x' in FIG. 26A, and FIG. 26C is a cross-sectional view taken along line y-y' in FIG. 26A.

FIG. 27A is a plan view related to the method for producing a semiconductor device according to an embodiment, FIG. 27B is a cross-sectional view taken along line x-x' in FIG. 27A, and FIG. 27C is a cross-sectional view taken along line y-y' in FIG. 27A.

FIG. 29A is a plan view related to the method for producing a semiconductor device according to an embodiment, FIG. 29B is a cross-sectional view taken along line x-x' in FIG. 29A, and FIG. 29C is a cross-sectional view taken along line y-y' in FIG. 29A.

FIG. 31A is a plan view related to the method for producing a semiconductor device according to an embodiment, FIG. 31B is a cross-sectional view taken along line x-x' in FIG. 31A, and FIG. 31C is a cross-sectional view taken along line y-y' in FIG. 31A.

FIG. 32A is a plan view related to the method for producing a semiconductor device according to an embodiment, FIG. 32B is a cross-sectional view taken along line x-x' in FIG. 32A, and FIG. 32C is a cross-sectional view taken along line y-y' in FIG. 32A.

FIG. 36A is a plan view related to the method for producing a semiconductor device according to an embodiment, FIG. 36B is a cross-sectional view taken along line x-x' in FIG. 36A, and FIG. 36C is a cross-sectional view taken along line y-y' in FIG. 36A.

FIG. 38A is a plan view related to the method for producing a semiconductor device according to an embodiment, FIG. 38B is a cross-sectional view taken along line x-x' in FIG. 38A, and FIG. 38C is a cross-sectional view taken along line y-y' in FIG. 38A.

FIG. 39A is a plan view related to the method for producing a semiconductor device according to an embodiment, FIG. 39B is a cross-sectional view taken along line x-x' in FIG. 39A, and FIG. 39C is a cross-sectional view taken along line y-y' in FIG. 39A.

FIG. 40A is a plan view related to the method for producing a semiconductor device according to an embodiment, FIG. 40B is a cross-sectional view taken along line x-x' in FIG. 40A, and FIG. 40C is a cross-sectional view taken along line y-y' in FIG. 40A.

DETAILED DESCRIPTION OF THE PREFERRED EMBODIMENTS

Production steps for forming an SGT structure according to an embodiment of the present invention will now be described with reference to FIGS. 2A to 40C.

First, a first step of forming a fin-shaped semiconductor layer on a semiconductor substrate and forming a first insulating film around the fin-shaped semiconductor layer is described. In this embodiment, a silicon substrate is used as the semiconductor substrate but a substrate composed of any other semiconductor may be used.

As illustrated in FIGS. 2A to 2C, a first resist 102 for forming a fin-shaped silicon layer is formed on a silicon substrate 101.

As illustrated in FIGS. 3A to 3C, the silicon substrate 101 is etched to form a fin-shaped silicon layer 103. Although a resist mask is used to form a fin-shaped silicon layer in this embodiment, a hard mask such as an oxide film or a nitride film may be used instead.

Figure 4A:
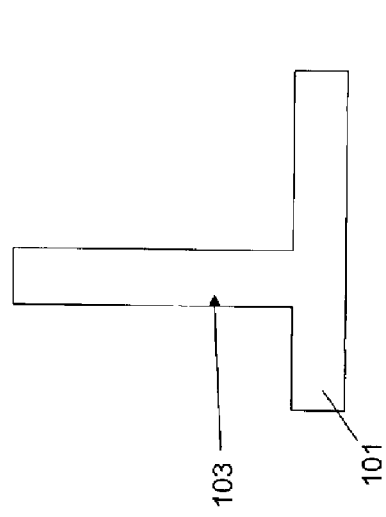
FIG. 4A is a plan view related to the method for producing a semiconductor device according to an embodiment.
Figure 4B:
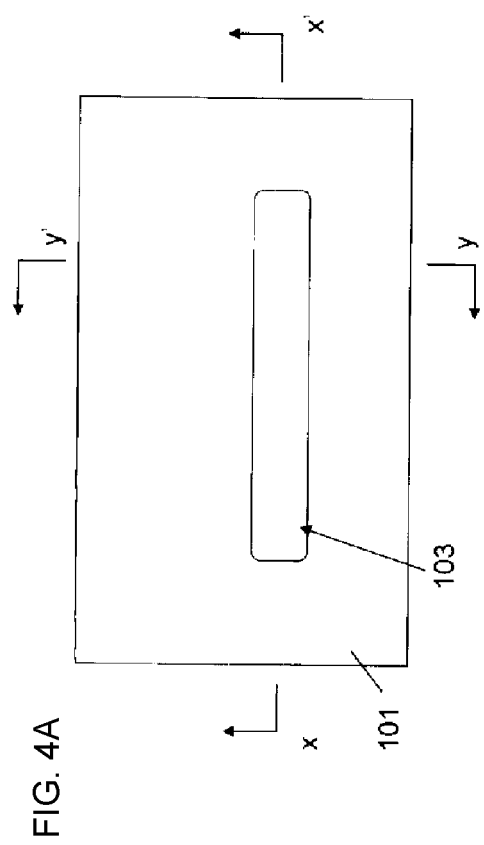
FIG. 4B is a cross-sectional view taken along line x-x' in FIG. 4A.
Figure 4C:
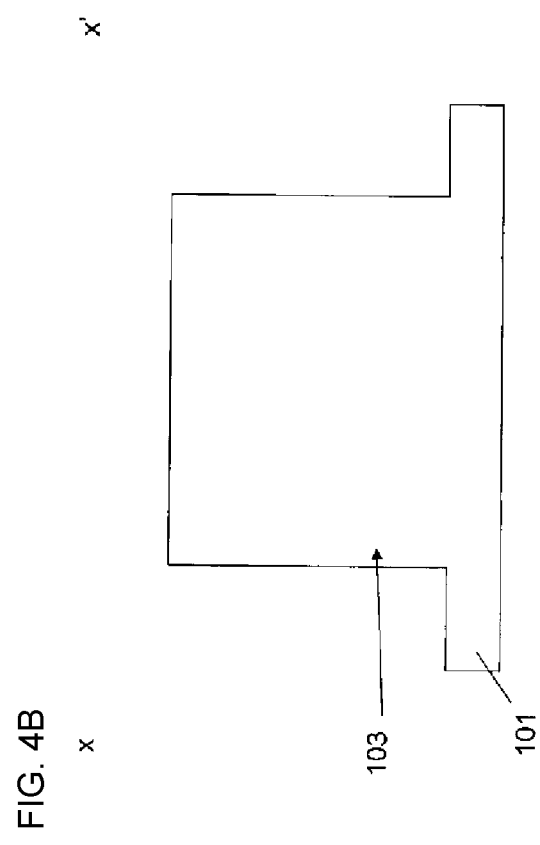
FIG. 4C is a cross-sectional view taken along line y-y' in FIG. 4A.

As illustrated in FIGS. 4A to 4C, the first resist 102 is removed.

Figure 5A:
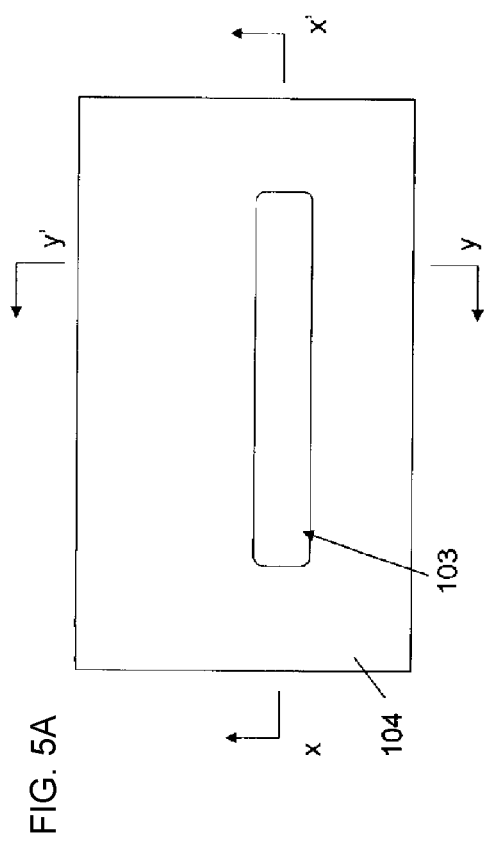
FIG. 5A is a plan view related to the method for producing a semiconductor device according to an embodiment.
Figure 5C:
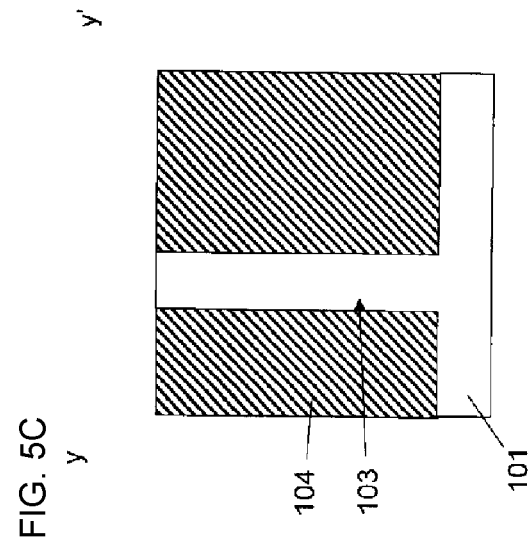
FIG. 5C is a cross-sectional view taken along line y-y' in FIG. 5A.
Figure 5B:
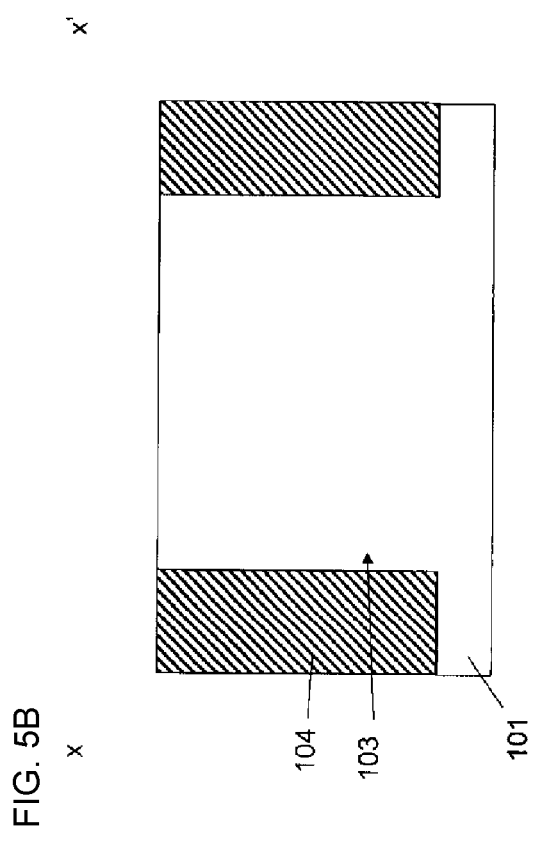
FIG. 5B is a cross-sectional view taken along line x-x' in FIG. 5A.

As illustrated in FIGS. 5A to 5C, a first insulating film 104 is deposited around the fin-shaped silicon layer 103. An oxide film formed by high-density plasma or an oxide film formed by low-pressure chemical vapor deposition (CVD) may be used as the first insulating film 104.

As illustrated in FIGS. 6A to 6C, the first insulating film 104 is etched back to expose an upper portion of the fin-shaped silicon layer 103. The steps up to here are the same as those of a method for making a fin-shaped silicon layer described in IEDM 2010, C C. Wu, et. al, 27.1.1-27.1.4.

The description up to here has shown a first step of forming a fin-shaped silicon layer 103 on a silicon substrate 101 and forming a first insulating film 104 around the fin-shaped silicon layer 103.

Described next is a second step that includes forming a second insulating film around the fin-shaped semiconductor layer, depositing a first polysilicon on the second insulating film to conduct planarization, forming a second resist for forming a gate line and a pillar-shaped semiconductor layer so that the second resist extends in a direction perpendicular to a direction in which the fin-shaped semiconductor layer extends, and etching the first polysilicon, the second insulating film, and the fin-shaped semiconductor layer to form a pillar-shaped semiconductor layer and a first dummy gate formed of the first polysilicon.

Figure 7A:
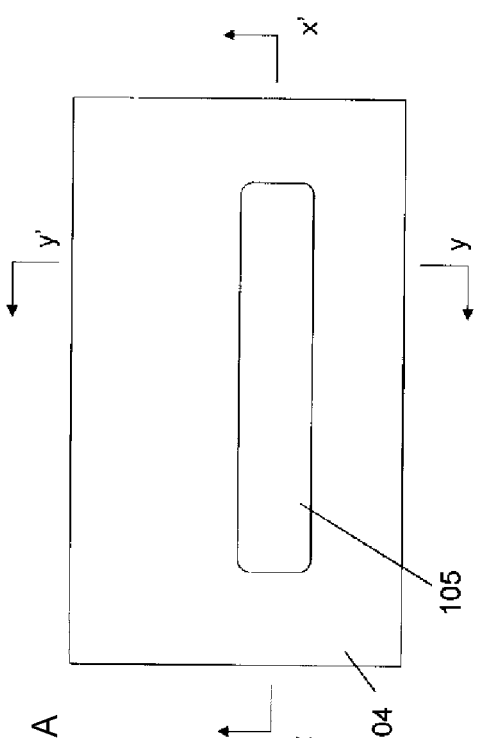
FIG. 7A is a plan view related to the method for producing a semiconductor device according to an embodiment.
Figure 7C:
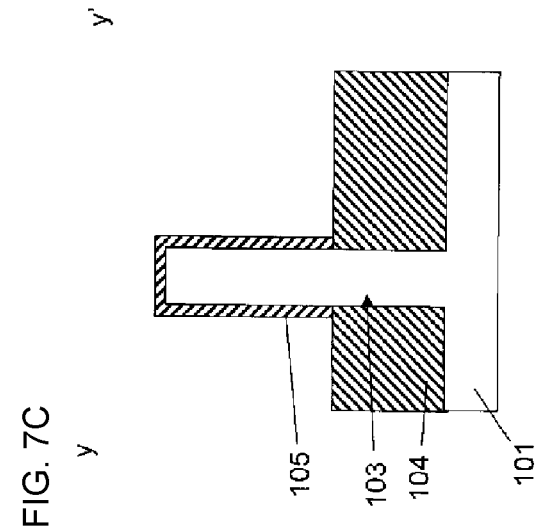
FIG. 7C is a cross-sectional view taken along line y-y' in FIG. 7A.
Figure 7B:
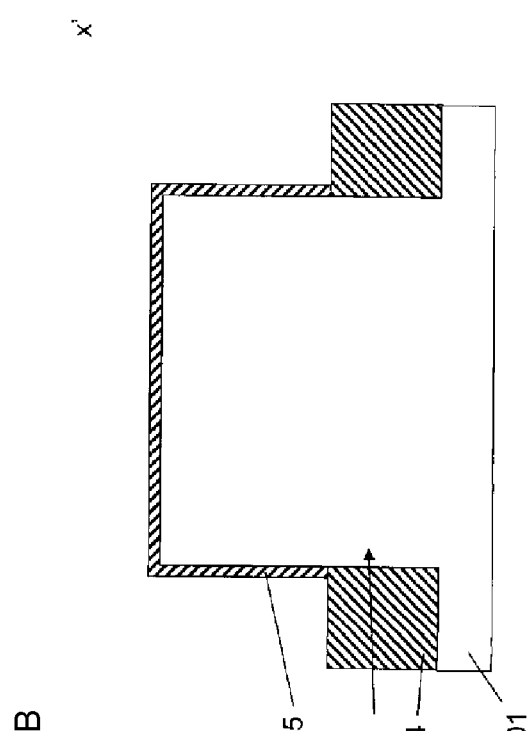
FIG. 7B is a cross-sectional view taken along line x-x' in FIG. 7A.

As illustrated in FIGS. 7A to 7C, a second insulating film 105 is formed around the fin-shaped silicon layer 103. The second insulating film 105 is preferably an oxide film.

As illustrated in FIGS. 8A to 8C, a first polysilicon 106 is deposited on the second insulating film 105 to conduct planarization.

As illustrated in FIGS. 9A to 9C, a third insulating film 107 is formed on the first polysilicon 106. The third insulating film 107 is preferably a nitride film.

Figure 10C:
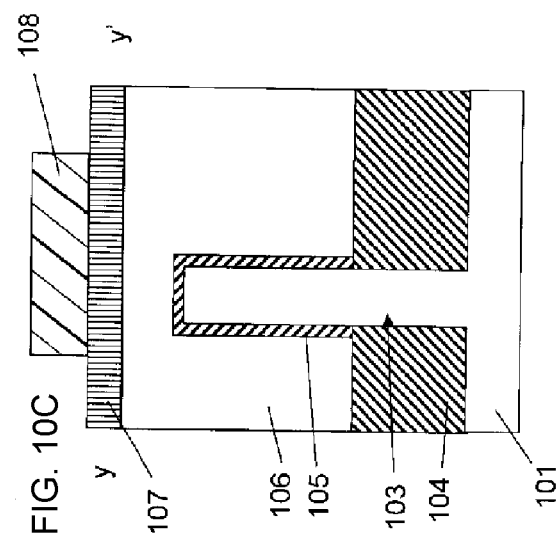
FIG. 10C is a cross-sectional view taken along line y-y' in FIG. 10A.
Figure 10A:
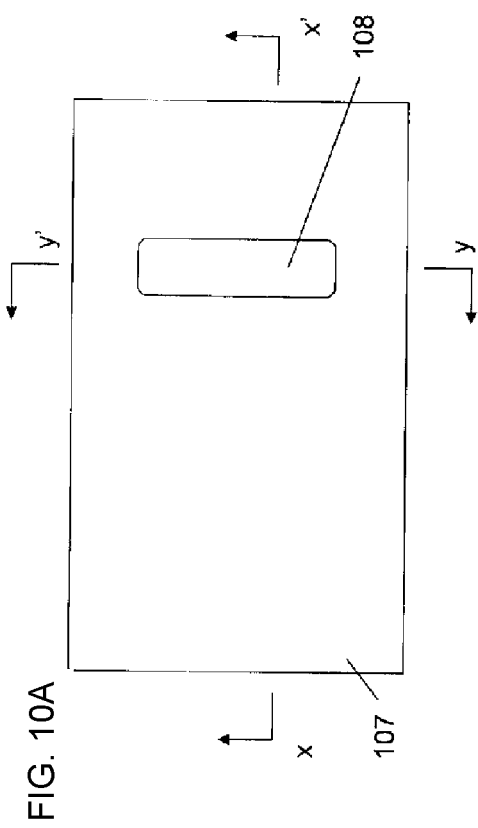
FIG. 10A is a plan view related to the method for producing a semiconductor device according to an embodiment.
Figure 10B:
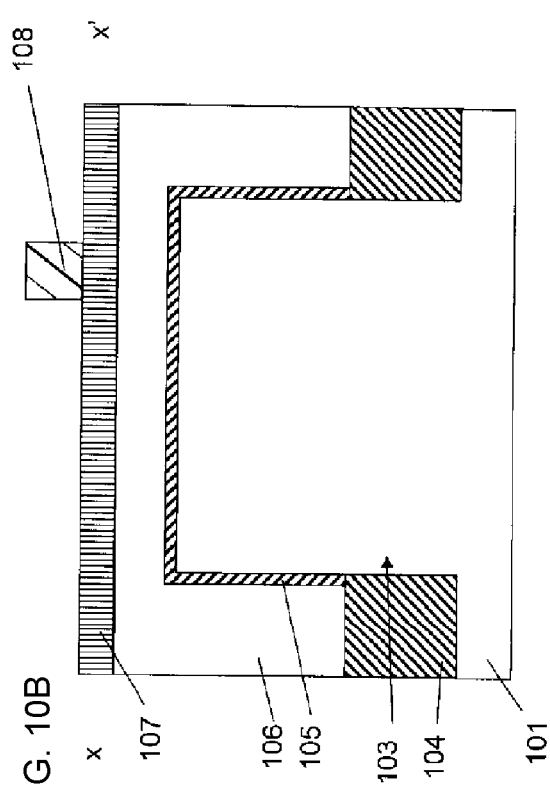
FIG. 10B is a cross-sectional view taken along line x-x' in FIG. 10A.

As illustrated in FIGS. 10A to 10C, a second resist 108 for forming a gate line and a pillar-shaped silicon layer is formed so as to extend in a direction perpendicular to the direction in which the fin-shaped silicon layer 103 extends.

As illustrated in FIGS. 11A to 11C, the third insulating film 107, the first polysilicon 106, the second insulating film 105, and the fin-shaped silicon layer 103 are etched to form a pillar-shaped silicon layer 109 and a first dummy gate 106 formed of the first polysilicon. If the second resist is removed by etching, the third insulating film 107 serves as a hard mask. If the second resist remains during etching, the third insulating film is not necessarily used.

Figure 12C:
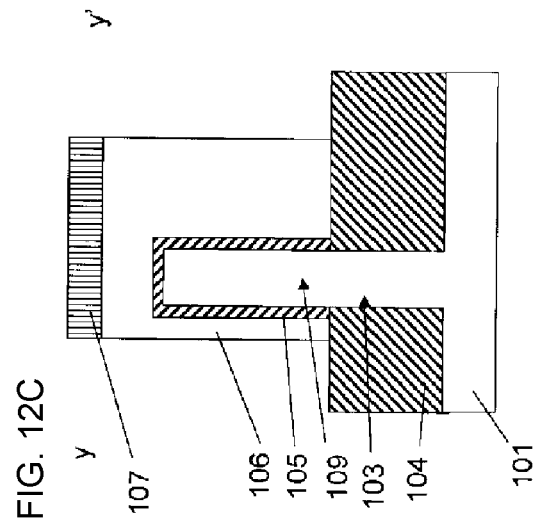
FIG. 12C is a cross-sectional view taken along line y-y' in FIG. 12A.
Figure 12A:
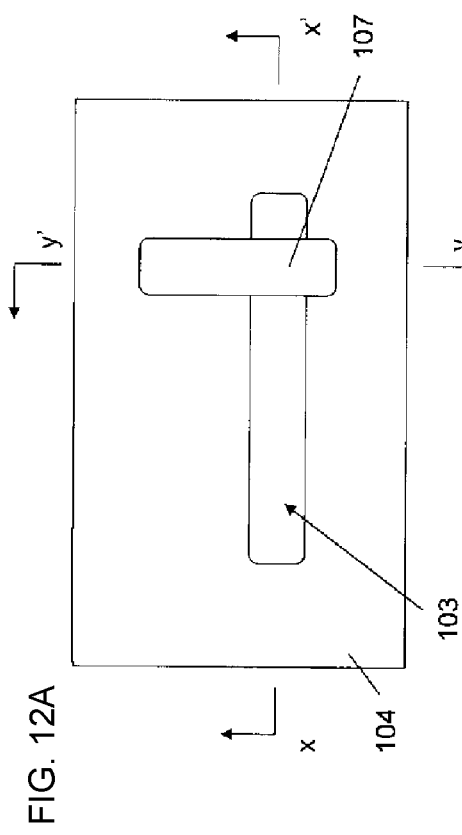
FIG. 12A is a plan view related to the method for producing a semiconductor device according to an embodiment.
Figure 12B:
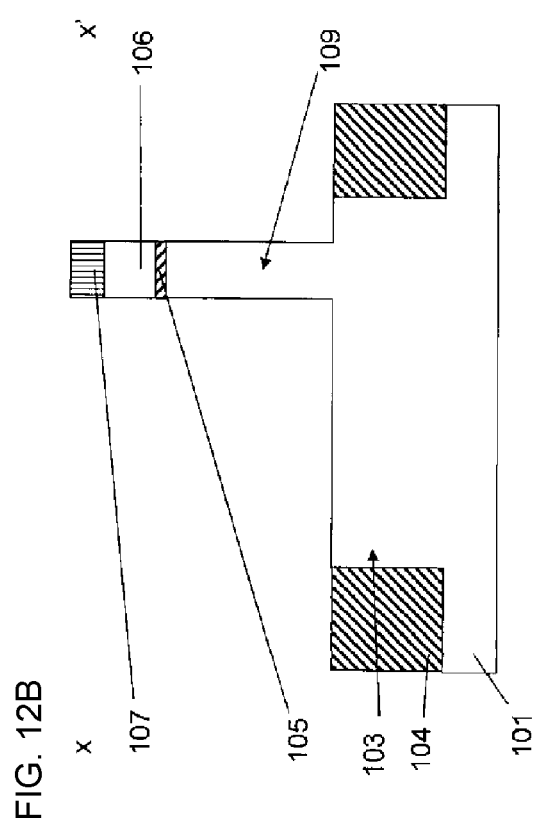
FIG. 12B is a cross-sectional view taken along line x-x' in FIG. 12A.

As illustrated in FIGS. 12A to 12C, the second resist 108 is removed.

The description up to here has shown a second step that includes forming a second insulating film around the fin-shaped semiconductor layer, depositing a first polysilicon on the second insulating film to conduct planarization, forming a second resist for forming a gate line and a pillar-shaped semiconductor layer so that the second resist extends in a direction perpendicular to a direction in which the fin-shaped semiconductor layer extends, and etching the first polysilicon, the second insulating film, and the fin-shaped semiconductor layer to form a pillar-shaped semiconductor layer and a first dummy gate formed of the first polysilicon.

Described next is a third step that follows the second step and includes forming a fourth insulating film around the pillar-shaped semiconductor layer and the first dummy gate, depositing a second polysilicon around the fourth insulating film, and performing etching so that the second polysilicon remains on side walls of the first dummy gate and the pillar-shaped semiconductor layer and forms a second dummy gate.

As illustrated in FIGS. 13A to 13C, a fourth insulating film 110 is formed around the pillar-shaped silicon layer 109 and the first dummy gate 106. The fourth insulating film 110 is preferably an oxide film.

As illustrated in FIGS. 14A to 14C, a third resist 111 is formed and etched back to expose an upper portion of the pillar-shaped silicon layer 109.

Figure 15A:
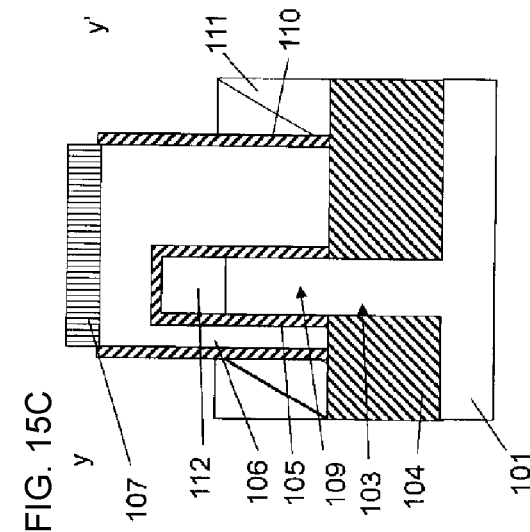
FIG. 15A is a plan view related to the method for producing a semiconductor device according to an embodiment.
Figure 15B:
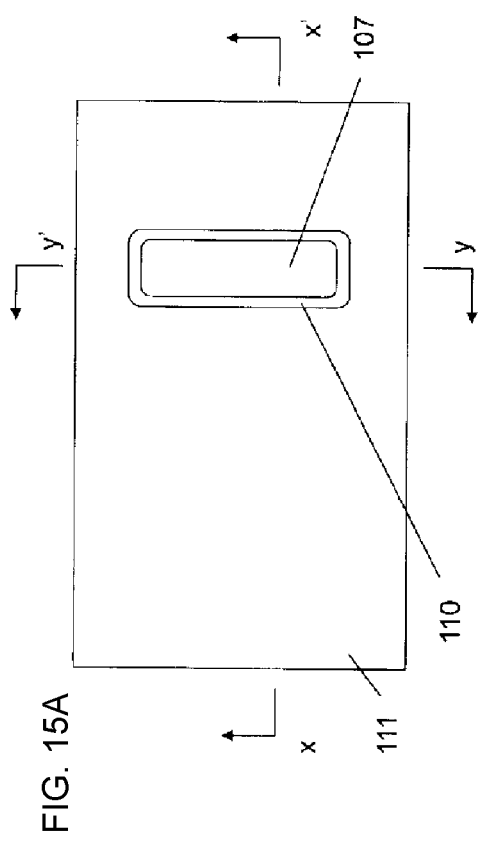
FIG. 15B is a cross-sectional view taken along line x-x' in FIG. 15A.
Figure 15C:
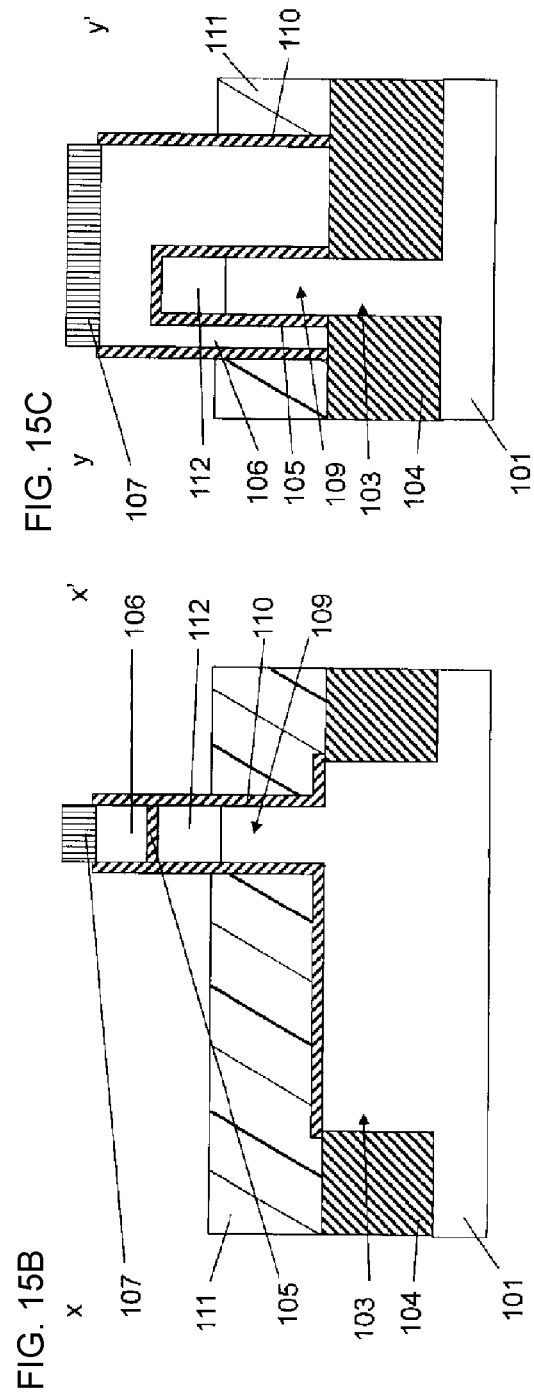
FIG. 15C is a cross-sectional view taken along line y-y' in FIG. 15A.

As illustrated in FIGS. 15A to 15C, an impurity is introduced to form a first diffusion layer 112 in the upper portion of the pillar-shaped silicon layer 109. Arsenic or phosphorus is preferably introduced to form an n-type diffusion layer. Boron is preferably introduced to form a p-type diffusion layer.

As illustrated in FIGS. 16A to 16C, the third resist 111 is removed.

As illustrated in FIGS. 17A to 17C, a second polysilicon 113 is deposited around the fourth insulating film 110.

As illustrated in FIGS. 18A to 18C, the second polysilicon 113 is etched so that the second polysilicon 113 remains on side walls of the first dummy gate 106 and the pillar-shaped silicon layer 109 and forms a second dummy gate 113.

The description up to here has shown third step that follows the second step and includes forming a fourth insulating film around the pillar-shaped semiconductor layer and the first dummy gate, depositing a second polysilicon around the fourth insulating film, and performing etching so that the second polysilicon remains on side walls of the first dummy gate and the pillar-shaped semiconductor layer and forms a second dummy gate.

Described next is a fourth step that includes forming a fifth insulating film around the second dummy gate, etching the fifth insulating film to have a side wall shape so as to form a side wall formed of the fifth insulating film, forming a second diffusion layer in an upper portion of the fin-shaped semiconductor layer and a lower portion of the pillar-shaped semiconductor layer, and forming a metal-semiconductor compound on the second diffusion layer.

Figure 19A:
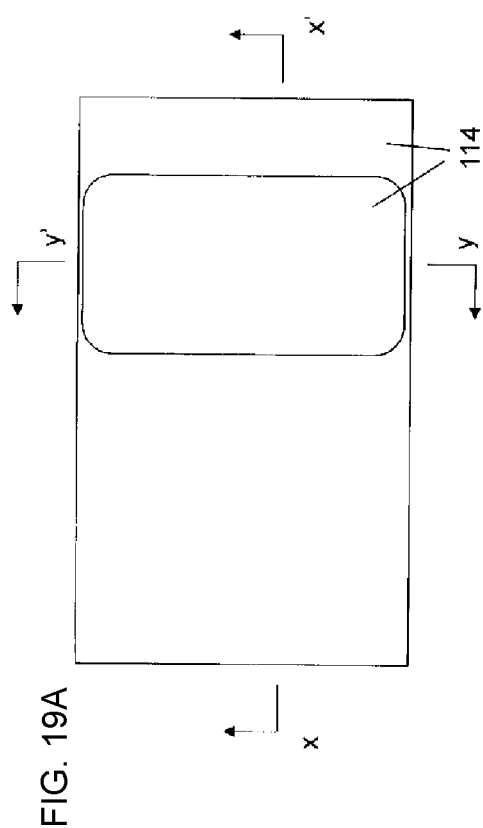
FIG. 19A is a plan view related to the method for producing a semiconductor device according to an embodiment.
Figure 19B:
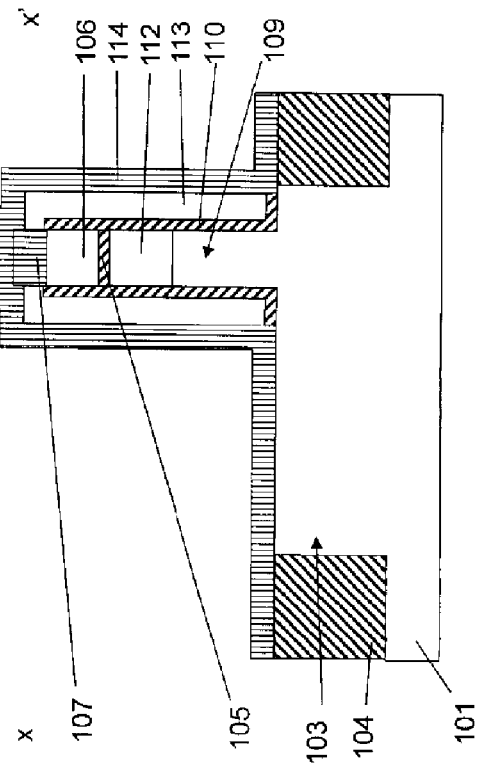
FIG. 19B is a cross-sectional view taken along line x-x' in FIG. 19A.
Figure 19C:
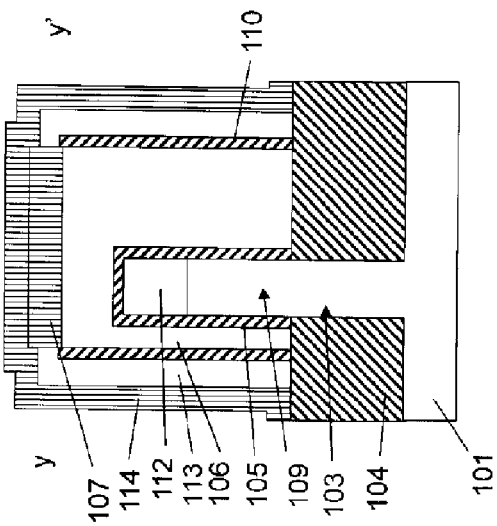
FIG. 19C is a cross-sectional view taken along line y-y' in FIG. 19A.

As illustrated in FIGS. 19A to 19C, a fifth insulating film 114 is formed around the second dummy gate 113. The fifth insulating film 114 is preferably a nitride film.

As illustrated in FIGS. 20A to 20C, the fifth insulating film 114 is etched to have a side wall shape. As a result, a side wall 114 formed of the fifth insulating film is formed.

As illustrated in FIGS. 21A to 21C, an impurity is introduced to form a second diffusion layer 115 in an upper portion of the fin-shaped silicon layer 103 and a lower portion of the pillar-shaped silicon layer 109. Arsenic or phosphorus is preferably introduced to form an n-type diffusion layer. Boron is preferably introduced to form a p-type diffusion layer.

As illustrated in FIGS. 22A to 22C, a metal-semiconductor compound 116 is formed on the second diffusion layer 115. A metal-semiconductor compound 117 is also formed in an upper portion of the second dummy gate 113 during this process.

The description up to here shows a fourth step that includes forming a fifth insulating film around the second dummy gate, etching the fifth insulating film to have a side wall shape so as to form a side wall formed of the fifth insulating film, forming a second diffusion layer in an upper portion of the fin-shaped semiconductor layer and a lower portion of the pillar-shaped semiconductor layer, and forming a metal-semiconductor compound on the second diffusion layer.

Described next is a fifth step following the fourth step, the fifth step including depositing a contact stopper film, depositing an interlayer insulating film and performing chemical mechanical polishing to expose an upper portion of the second dummy gate and an upper portion of the first dummy gate, removing the second dummy gate and the first dummy gate, removing the second insulating film and the fourth insulating film, forming a gate insulating film around the pillar-shaped semiconductor layer and on inner sides of the fifth insulating film, depositing a metal, and performing etch-back to form a gate electrode and a gate line.

As illustrated in FIGS. 23A to 23C, a contact stopper film 118 is deposited and an interlayer insulating film 119 is deposited. The contact stopper film 118 is preferably a nitride film.

As illustrated in FIGS. 24A to 24C, chemical mechanical polishing is performed to expose an upper portion of the second dummy gate 113 and an upper portion of the first dummy gate 106. During this process, the metal-semiconductor compound 117 formed in the upper portion of the second dummy gate 113 is removed.

Figure 25A:
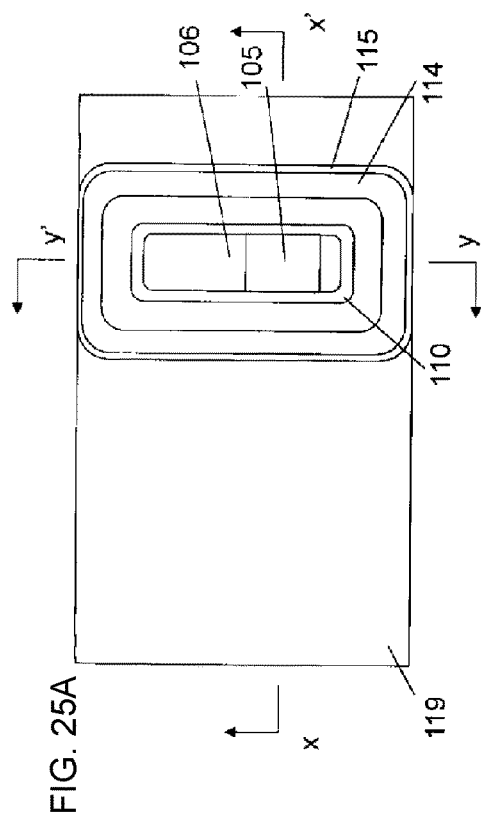
FIG. 25A is a plan view related to the method for producing a semiconductor device according to an embodiment.
Figure 25C:
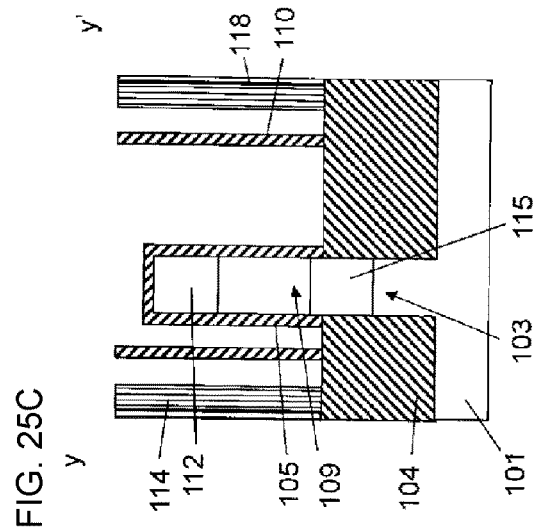
FIG. 25C is a cross-sectional view taken along line y-y' in FIG. 25A.
Figure 25B:
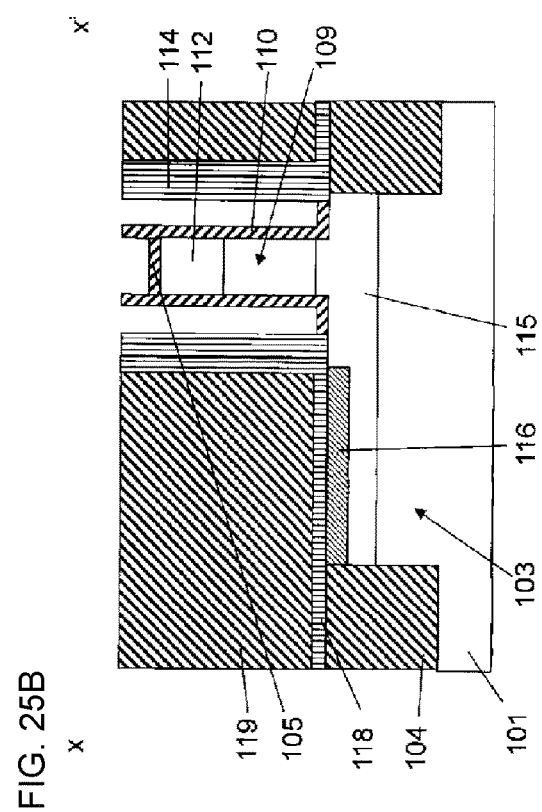
FIG. 25B is a cross-sectional view taken along line x-x' in FIG. 25A.

As illustrated in FIGS. 25A to 25C, the second dummy gate 113 and the first dummy gate 106 are removed.

As illustrated in FIGS. 26A to 26C, the second insulating film 105 and the fourth insulating film 110 are removed.

As illustrated in FIGS. 27A to 27C, a gate insulating film 120 is formed around the pillar-shaped silicon layer 109 and on inner sides of the fifth insulating film (side wall) 114, and a metal 121 is deposited. A gate electrode 121a is formed around the pillar-shaped silicon layer 109. A gate line 121b is also formed. Since the gate insulating film 120 is formed around and at bottoms of the gate electrode 121a and the gate line 121b, the gate electrode 121a and the gate line 121b can be insulated from the pillar-shaped silicon layer 109 and the fin-shaped silicon layer 103.

Figure 28A:
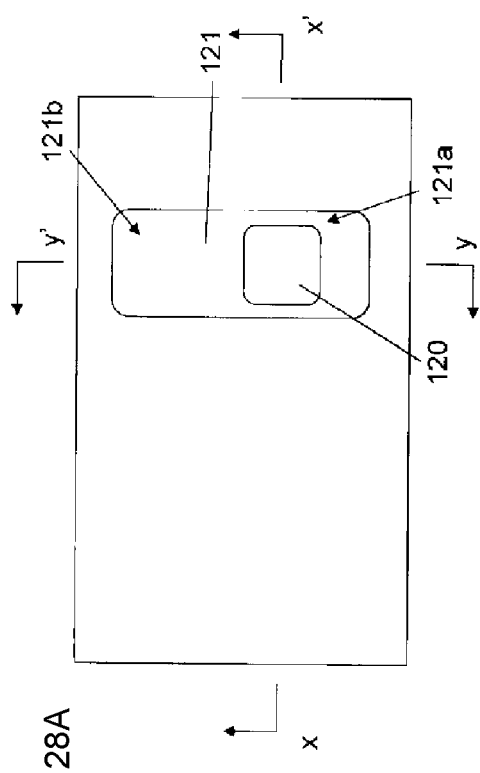
FIG. 28A is a plan view related to the method for producing a semiconductor device according to an embodiment.
Figure 28C:
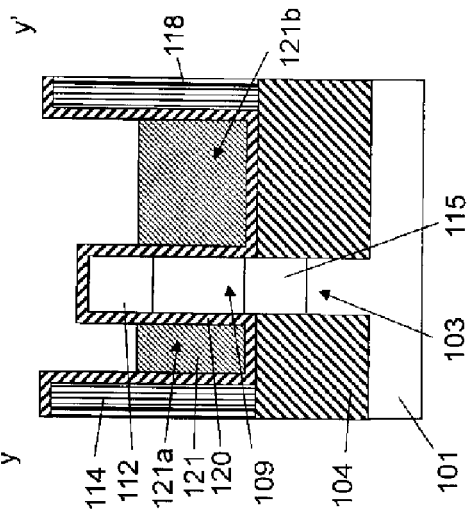
FIG. 28C is a cross-sectional view taken along line y-y' in FIG. 28A.
Figure 28B:
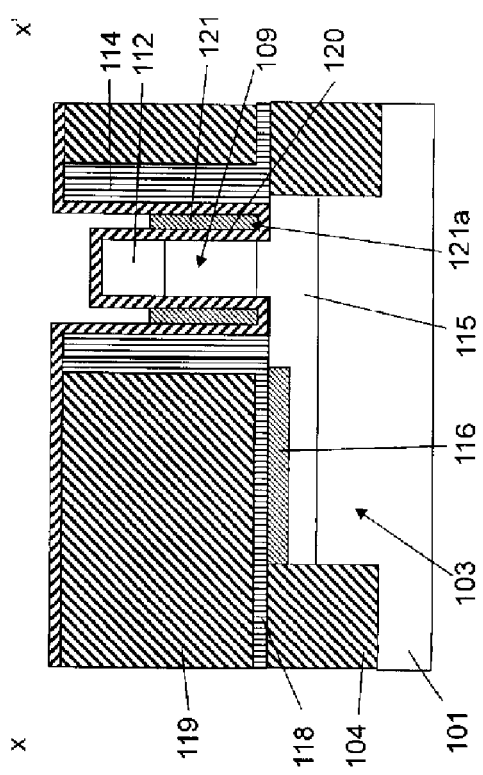
FIG. 28B is a cross-sectional view taken along line x-x' in FIG. 28A.

As illustrated in FIGS. 28A to 28C, the metal 121 is etched back to expose an upper portion of the pillar-shaped silicon layer 109.

The description up to here shows a fifth step following the fourth step, the fifth step including depositing a contact stopper film, depositing an interlayer insulating film and performing chemical mechanical polishing to expose an upper portion of the second dummy gate and an upper portion of the first dummy gate, removing the second dummy gate and the first dummy gate, removing the second insulating film and the fourth insulating film, forming a gate insulating film around the pillar-shaped semiconductor layer and on inner sides of the fifth insulating film, depositing a metal, and performing etch-back to form a gate electrode and a gate line.

As illustrated in FIGS. 29A to 29C, an oxide film 122 is deposited.

Figure 30A:
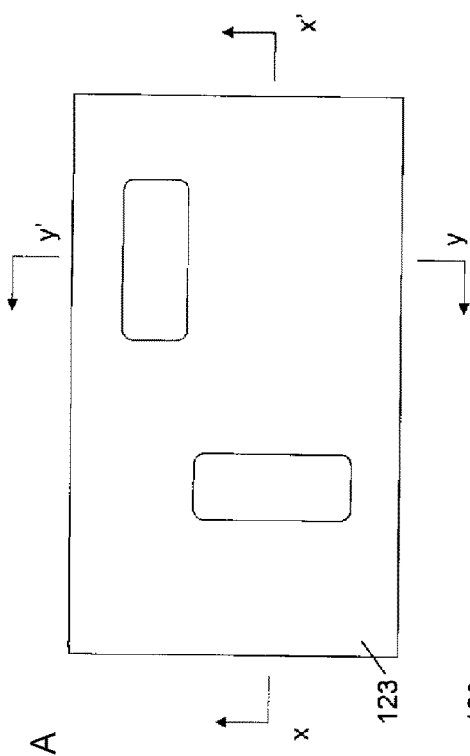
FIG. 30A is a plan view related to the method for producing a semiconductor device according to an embodiment.
Figure 30B:
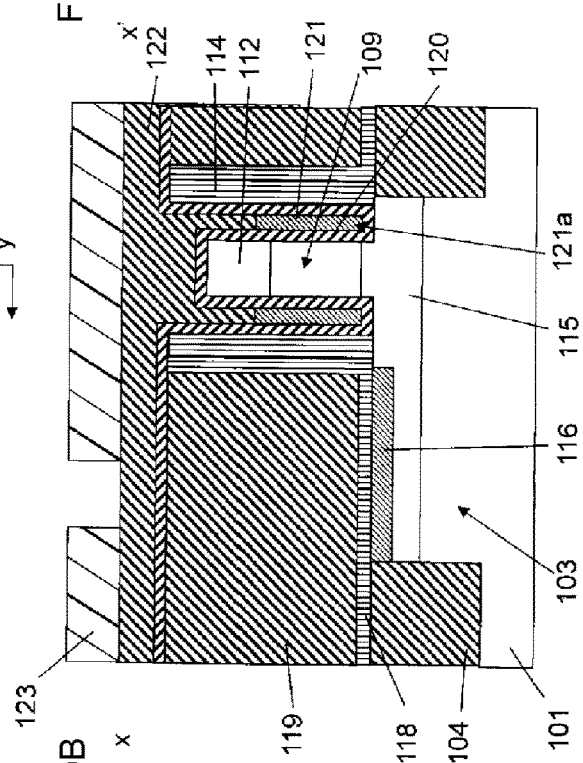
FIG. 30B is a cross-sectional view taken along line x-x' in FIG. 30A.
Figure 30C:
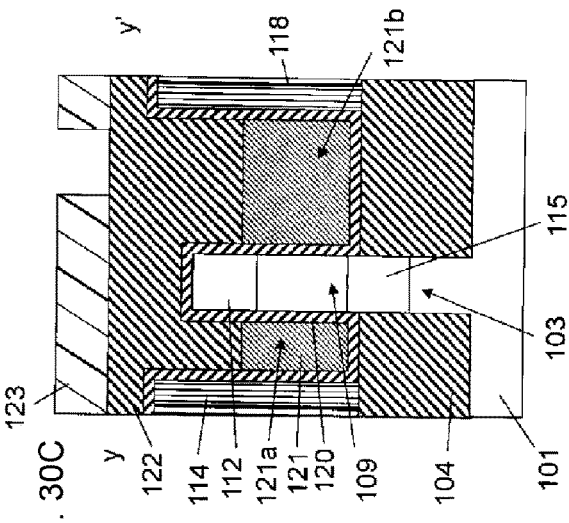
FIG. 30C is a cross-sectional view taken along line y-y' in FIG. 30A.

As illustrated in FIGS. 30A to 30C, a fourth resist 123 for forming contact holes is formed.

As illustrated in FIGS. 31A to 31C, the oxide film 122, the gate insulating film 120, and the interlayer insulating film 119 are etched to form contact holes 124 and 125.

As illustrated in FIGS. 32A to 32C, the fourth resist 123 is removed.

Figure 33A:
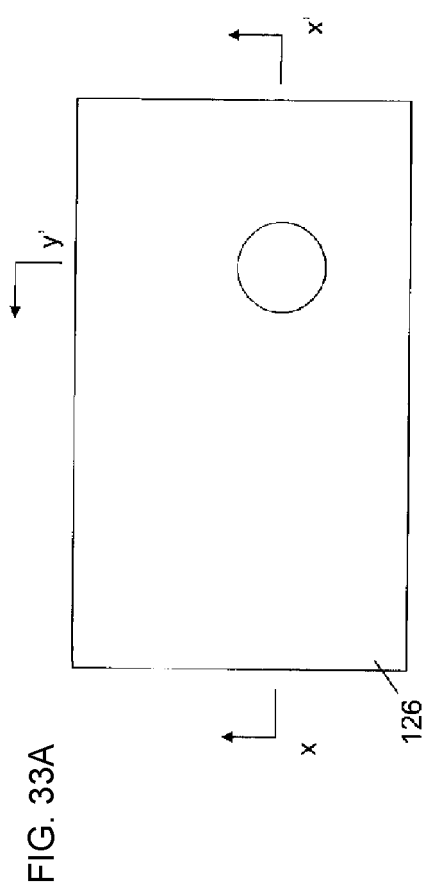
FIG. 33A is a plan view related to the method for producing a semiconductor device according to an embodiment.
Figure 33C:
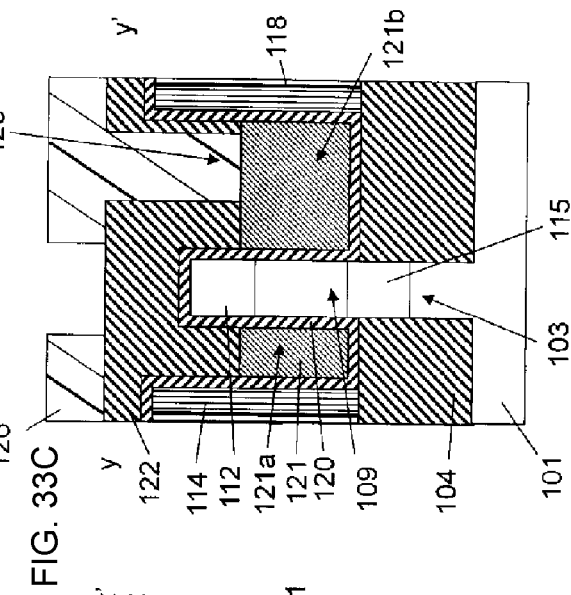
FIG. 33C is a cross-sectional view taken along line y-y' in FIG. 33A.
Figure 33B:
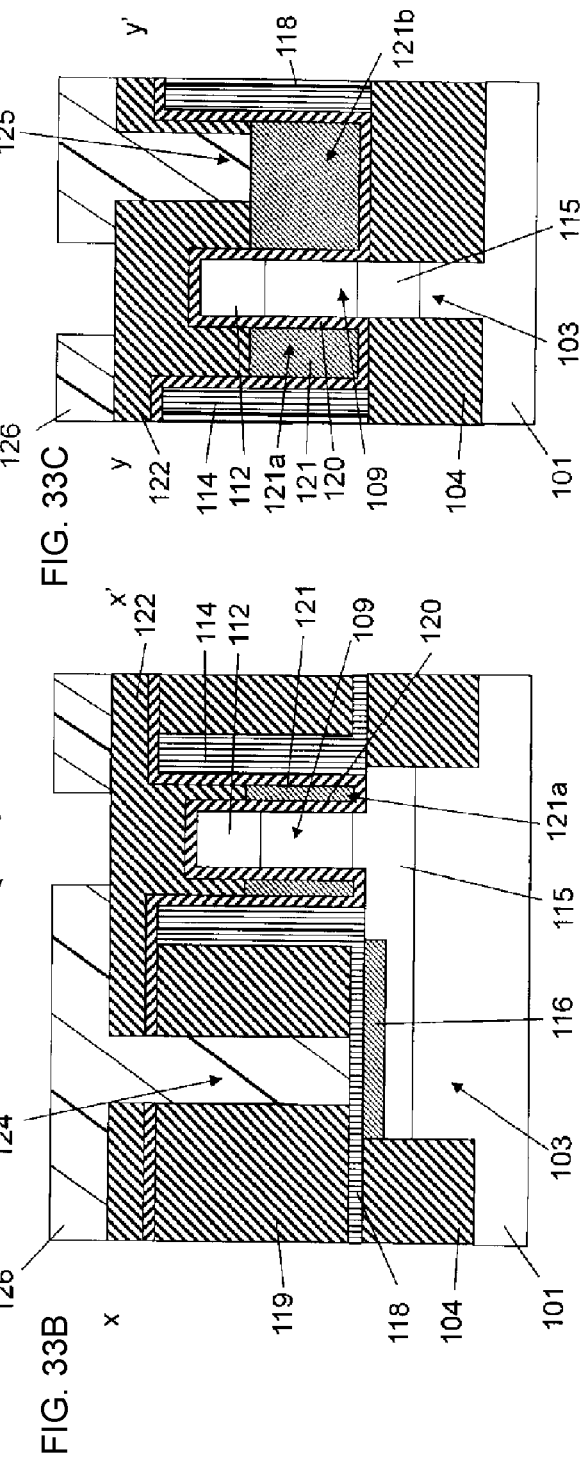
FIG. 33B is a cross-sectional view taken along line x-x' in FIG. 33A.

As illustrated in FIGS. 33A to 33C, a fifth resist 126 for forming a contact hole is formed.

Figure 34A:
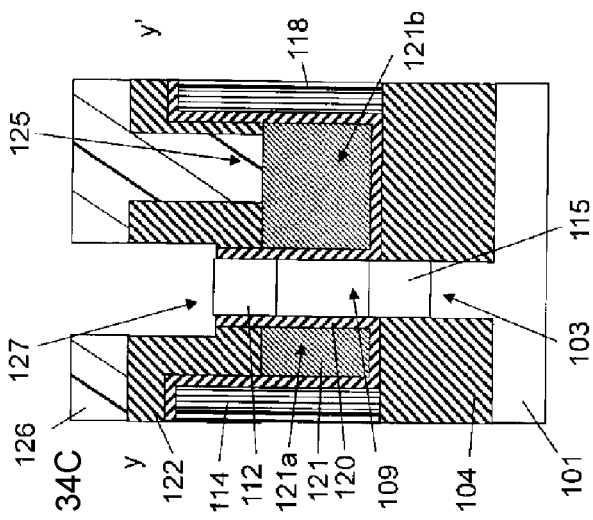
FIG. 34A is a plan view related to the method for producing a semiconductor device according to an embodiment.
Figure 34B:
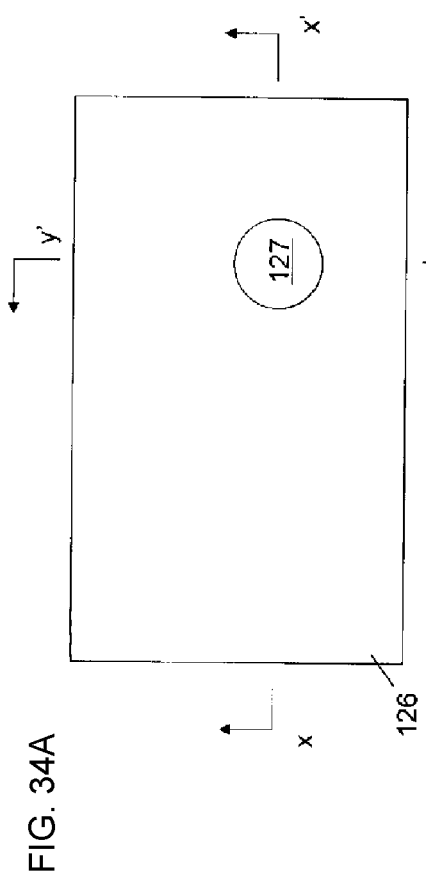
FIG. 34B is a cross-sectional view taken along line x-x' in FIG. 34A.
Figure 34C:
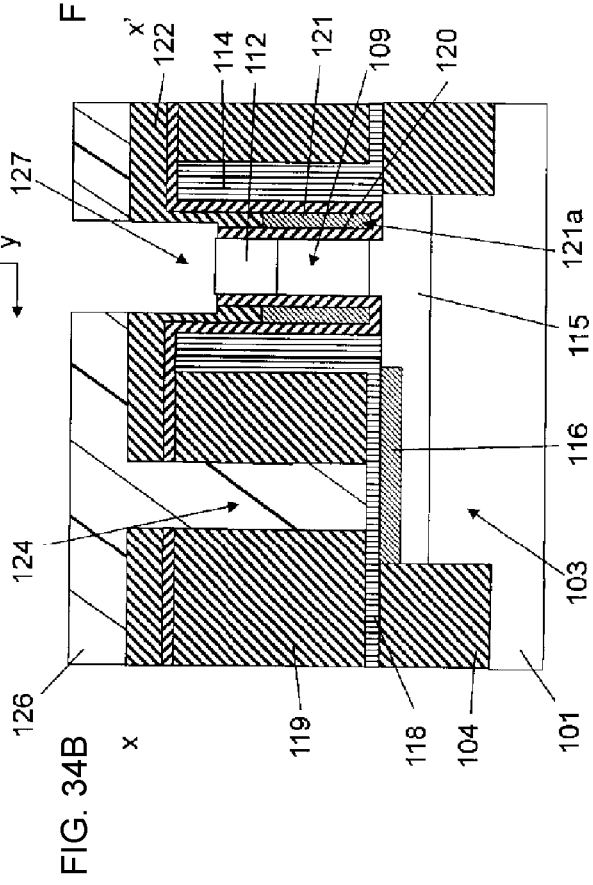
FIG. 34C is a cross-sectional view taken along line y-y' in FIG. 34A.

As illustrated in FIGS. 34A to 34C, the oxide film 122 and the gate insulating film 120 are etched to form a contact hole 127.

Figure 35A:
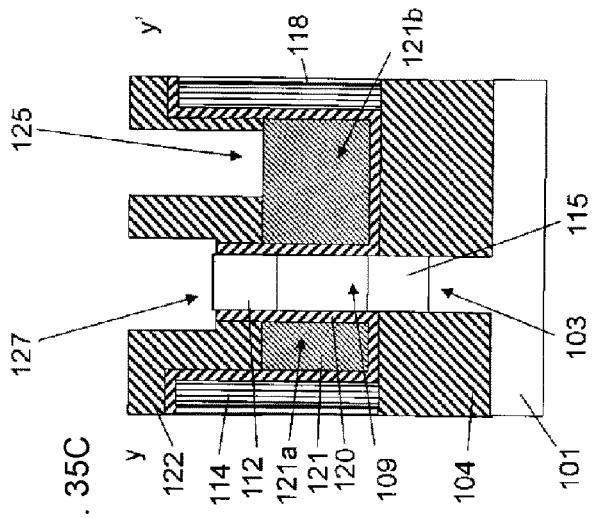
FIG. 35A is a plan view related to the method for producing a semiconductor device according to an embodiment.
Figure 35B:
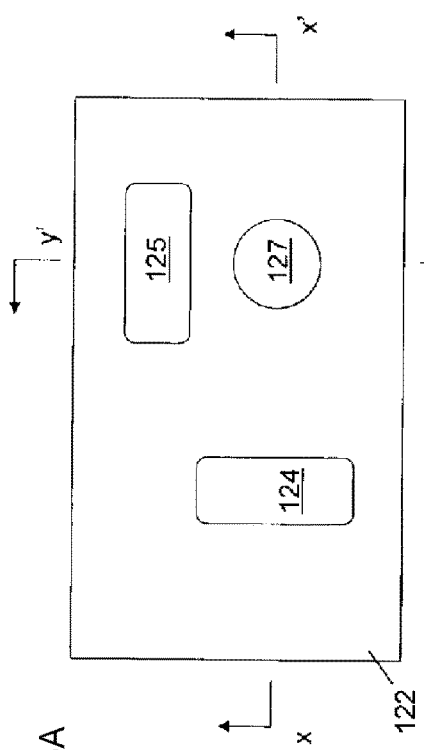
FIG. 35B is a cross-sectional view taken along line x-x' in FIG. 35A.
Figure 35C:
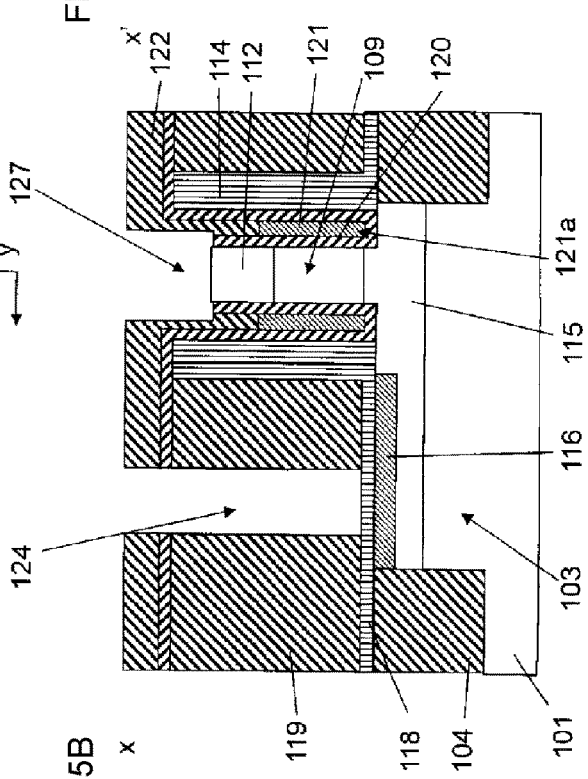
FIG. 35C is a cross-sectional view taken along line y-y' in FIG. 35A.

As illustrated in FIGS. 35A to 35C, the fifth resist 126 is removed.

As illustrated in FIGS. 36A to 36C, the contact stopper film 118 under the contact hole 124 is removed.

Figure 37A:
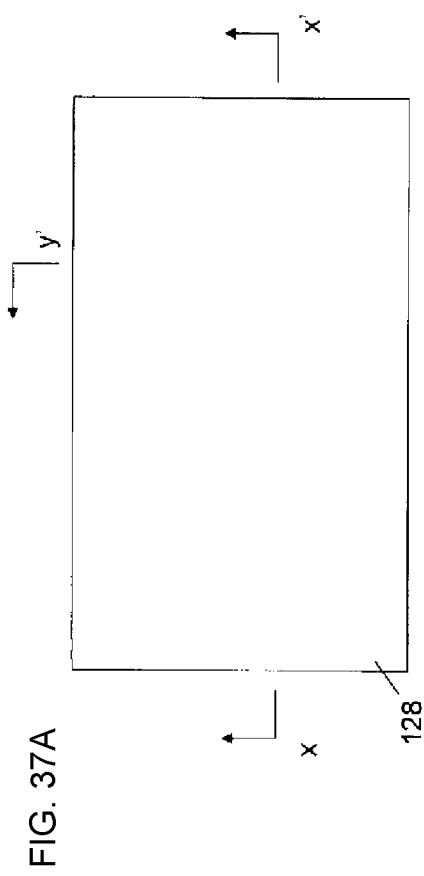
FIG. 37A is a plan view related to the method for producing a semiconductor device according to an embodiment.
Figure 37B:
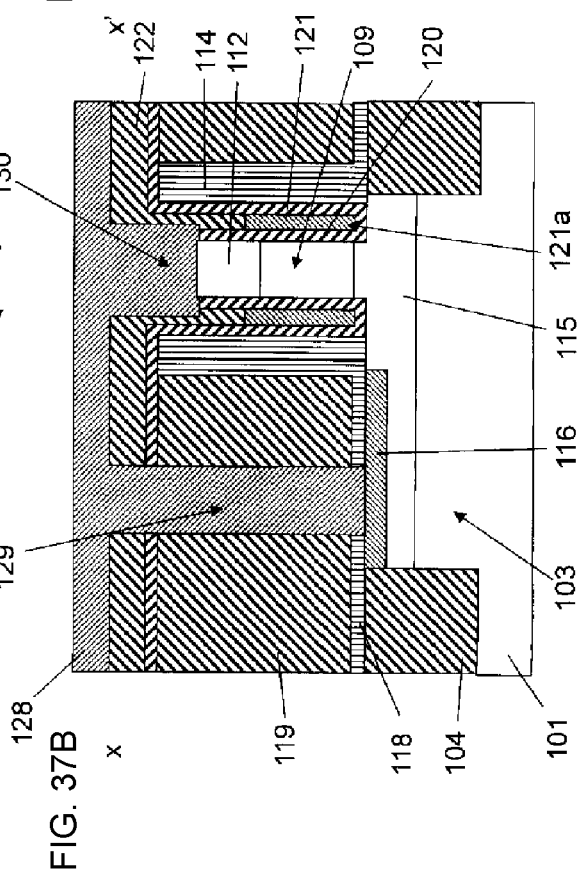
FIG. 37B is a cross-sectional view taken along line x-x' in FIG. 37A.
Figure 37C:
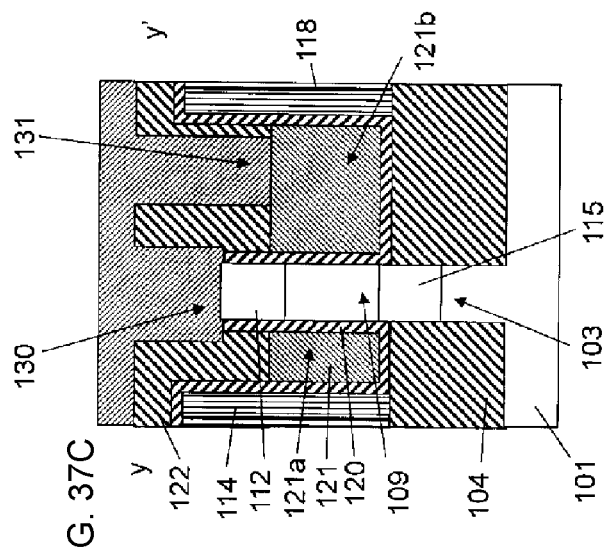
FIG. 37C is a cross-sectional view taken along line y-y' in FIG. 37A.

As illustrated in FIGS. 37A to 37C, a metal 128 is deposited to form contacts 129, 130, and 131 are formed.

As illustrated in FIGS. 38A to 38C, sixth resists 132, 133, and 134 for forming metal wiring are formed.

As illustrated in FIGS. 39A to 39C, the metal 128 is etched to form metal wiring 135, 136, and 137.

As illustrated in FIGS. 40A to 40C, the sixth resists 132, 133, and 134 are removed.

The description above has shown a method for producing an SGT through a gate-last process, in which a fin-shaped semiconductor layer, a pillar-shaped semiconductor layer, a gate electrode, and a gate line are formed by using two masks.

FIGS. 1A to 1C illustrate a structure of a semiconductor device obtained by the production method described above.

The semiconductor device includes a fin-shaped silicon layer 103 disposed on a silicon substrate 101, a first insulating film 104 disposed around the fin-shaped silicon layer 103, a pillar-shaped silicon layer 109 disposed on the fin-shaped silicon layer 103, a gate insulating film 120 disposed around the pillar-shaped silicon layer 109, a gate electrode 121a disposed around the gate insulating film 120 and formed of a metal, a gate line 121b connected to the gate electrode 121a and formed of a metal extending in a direction perpendicular to a direction in which the fin-shaped silicon layer 103 extends, a first diffusion layer 112 disposed in an upper portion of the pillar-shaped silicon layer 109, and a second diffusion layer 115 disposed in an upper portion of the fin-shaped silicon layer 103 and an lower portion of the pillar-shaped silicon layer 109. A width of the pillar-shaped silicon layer 109 in a direction perpendicular to the fin-shaped silicon layer 103 is equal to a width of the fin-shaped silicon layer 103 in the direction perpendicular to the direction in which the fin-shaped semiconductor layer extends. The gate insulating film is also disposed around and at bottoms of gate electrode and the gate line. An outer width W1 of the gate electrode 121a is equal to a width W2 of the gate line 121b.

Misalignment between the pillar-shaped silicon layer 109 and the gate line 121b can be eliminated since they are formed by self-alignment.

The gate electrode 121a and the gate line 121b can be insulated from the pillar-shaped silicon layer 109 and the fin-shaped silicon layer 103 due to the presence of the gate insulating film 120 formed around and at bottoms of the gate electrode 121a and the gate line 121b.

Various other embodiments and modifications are possible without departing from the scope and spirit of the present invention in a broad sense. The embodiments described above are merely illustrative and do not limit the scope of the present invention.

For example, the technical scope of the present invention naturally includes a method for producing a semiconductor device in which the conductivity types, p (including $p^+$) and n (including $n^+$), are reversed from the embodiments described above, and a semiconductor device obtained through the method.

The invention claimed is:

1. A method for producing a semiconductor device, comprising:
    a first step of forming a fin-shaped semiconductor layer on a semiconductor substrate and forming a first insulating film around the fin-shaped semiconductor layer; and
    a second step following the first step, the second step including:
    forming a second insulating film around the fin-shaped semiconductor layer,
    depositing a first polysilicon on the second insulating film,
    forming a second resist for forming a gate line and a pillar-shaped semiconductor layer so that the second resist extends in a direction perpendicular to a direction in which the fin-shaped semiconductor layer extends, and
    etching the first polysilicon, the second insulating film, and the fin-shaped semiconductor layer to form a pillar-shaped semiconductor layer and a first dummy gate, the first dummy gate comprising the first polysilicon.

2. The method for producing a semiconductor device according to claim 1, wherein the second step further includes, after depositing the first polysilicon on the second insulating film, forming a third insulating film on the first polysilicon.

3. The method for producing a semiconductor device according to claim 1, further comprising a third step following the second step, the third step including:
    forming a fourth insulating film around the pillar-shaped semiconductor layer and the first dummy gate,
    depositing a second polysilicon around the fourth insulating film, and
    performing etching so that the second polysilicon remains on side walls of the first dummy gate and the pillar-shaped semiconductor layer and forms a second dummy gate.

4. The method for producing a semiconductor device according to claim 3, wherein the third step further includes, after forming the fourth insulating film around the pillar-shaped semiconductor layer and the first dummy gate:
    forming a third resist,
    etching back the third resist to expose an upper portion of the pillar-shaped semiconductor layer, and
    forming a first diffusion layer in the upper portion of the pillar-shaped semiconductor layer.

5. The method for producing a semiconductor device according to claim 3, further comprising a fourth step including:
    forming a fifth insulating film around the second dummy gate,
    etching the fifth insulating film to form a side wall,
    forming a second diffusion layer in an upper portion of the fin-shaped semiconductor layer and a lower portion of the pillar-shaped semiconductor layer, and
    forming a metal-semiconductor compound on the second diffusion layer.

6. The method for producing a semiconductor device according to claim 5, further comprising a fifth step following the fourth step, the fifth step including:
    depositing a contact stopper film,
    depositing an interlayer insulating film,
    performing chemical mechanical polishing to expose an upper portion of the second dummy gate and an upper portion of the first dummy gate,
    removing the second dummy gate and the first dummy gate,
    removing the second insulating film and the fourth insulating film,
    forming a gate insulating film around the pillar-shaped semiconductor layer and on inner sides of the fifth insulating film,
    depositing a metal, and
    performing etch-back to form a gate electrode and the gate line.

* * * * *